US005497116A

United States Patent [19]

Rapeli

[11] Patent Number: 5,497,116

[45] Date of Patent: Mar. 5, 1996

[54] METHOD AND APPARATUS FOR PROCESSING SIGNALS

[75] Inventor: Juha Rapeli, Oulu, Finland

[73] Assignee: Nokia Mobile Phones Ltd., Salo, Finland

[21] Appl. No.: 226,557

[22] Filed: Apr. 12, 1994

[30] Foreign Application Priority Data

Apr. 23, 1993 [FI] Finland .................................. 931831

[51] Int. Cl.[6] .................................................. H03K 5/00

[52] U.S. Cl. .......................... 327/337; 327/554; 327/558

[58] Field of Search .................................. 327/336, 337, 327/339, 341, 343–345, 552, 554, 558

[56] References Cited

U.S. PATENT DOCUMENTS

| | | | |
|---|---|---|---|
| 4,228,366 | 10/1980 | Hüttemann et al. | 327/336 |
| 5,021,692 | 6/1991 | Hughes | 307/490 |
| 5,021,749 | 6/1991 | Kasai et al. | 327/554 |
| 5,039,963 | 8/1991 | Fischer | 333/173 |
| 5,109,169 | 4/1992 | Hughes | 327/337 |
| 5,376,891 | 12/1994 | Kirchlechner | 327/337 |
| 5,387,874 | 2/1995 | Rapeli | 327/336 |

FOREIGN PATENT DOCUMENTS

| | | |
|---|---|---|
| 0030824 | 6/1981 | European Pat. Off. . |
| 0322963 | 7/1989 | European Pat. Off. . |
| 0372647A3 | 6/1990 | European Pat. Off. . |
| 2933667A1 | 3/1981 | Germany . |

*Primary Examiner*—Timothy P. Callahan
*Assistant Examiner*—T. Lam
*Attorney, Agent, or Firm*—Perman & Green

[57] ABSTRACT

The present invention relats to a method for processing a signal, and a signal processing circuit according to the method, in which circuit one or two transistors (T1, T2) switched according to the switches are used as the active member of the entire circuit, the charge passing through said transistors being controlled, in addition to the switches, by the transferrable charge itself so that on concluded transfer of charge, all current flow in the circuit stops by itself. By means of the present invention, the signal processing is, irrespective of the polarity of the signal (positive or negative) and of the threshold voltages (Uth1, Uth2) of the transistors, linear because the signal voltage ($U_s$) is produced, as taught by the invention, relative to a reference voltage ($U_{Ref}$) of predetermined magnitude in that a sum of the signal voltage ($U_s$) and said reference voltage ($U_{Ref}$) is produced and the polarity of said sum is every time the same as the polarity of the reference voltage ($U_{Ref}$), irrespective of the variation of the signal voltage ($U_s$), and when charge samples proportional to the signal voltage ($U_s$) are taken, a quantity thereof is taken which is proportional to the sum ($U_s$+ $U_{Ref}$) of the signal voltage ($U_s$) and the reference voltage ($U_{Ref}$), whereby the charge samples pro-portional to said sum ($U_s$ + $U_{Ref}$) are transferred to the integrating capacitance ($C_o$) included in the circuit, and thereafter, a quantity of charge samples proportional to the reference voltage ($U_{Ref}$) is added into the integrating capacitance ($C_o$) with an opposite polarity relative to the polarity of the charge samples proportional to said sum ($U_s$ + $U_{Ref}$).

19 Claims, 9 Drawing Sheets

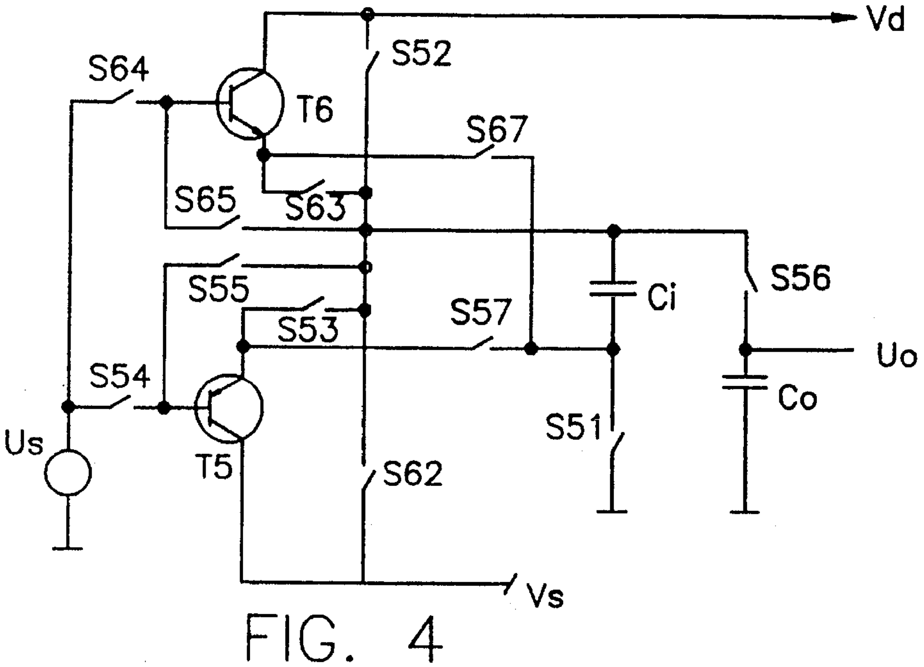
FIG. 4
FIG. 5A
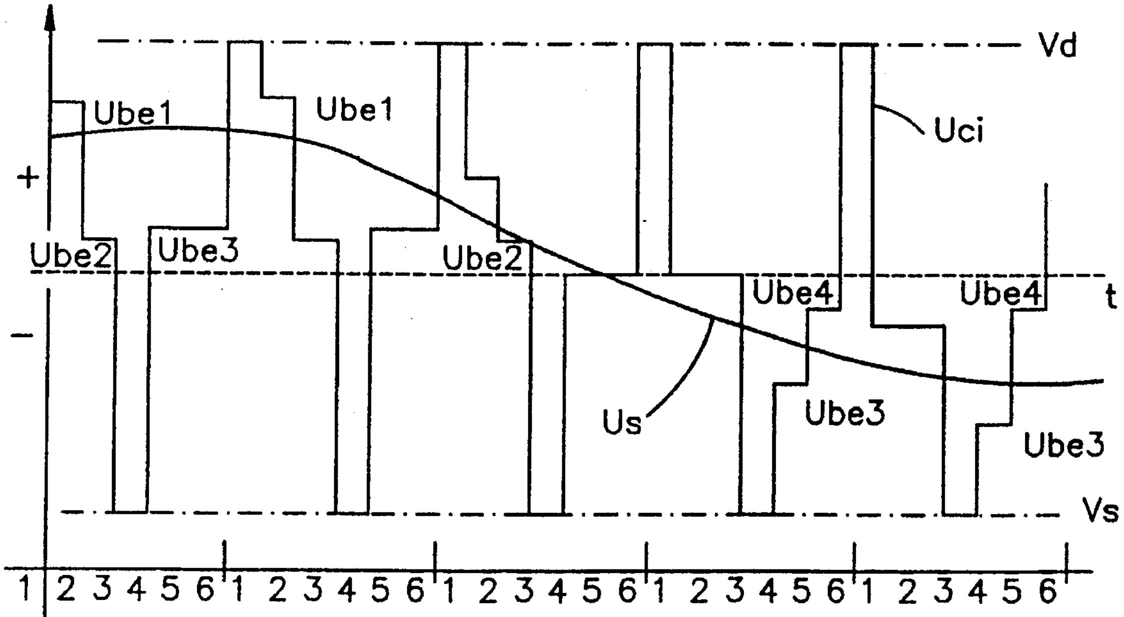
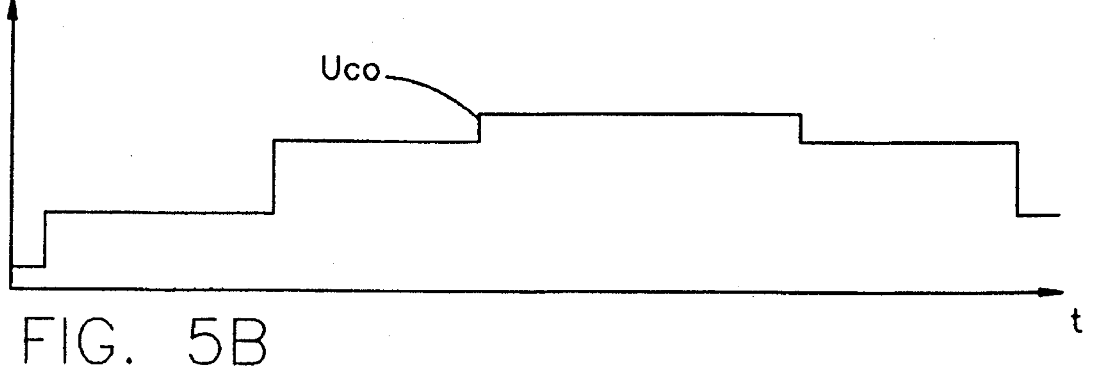
FIG. 5B

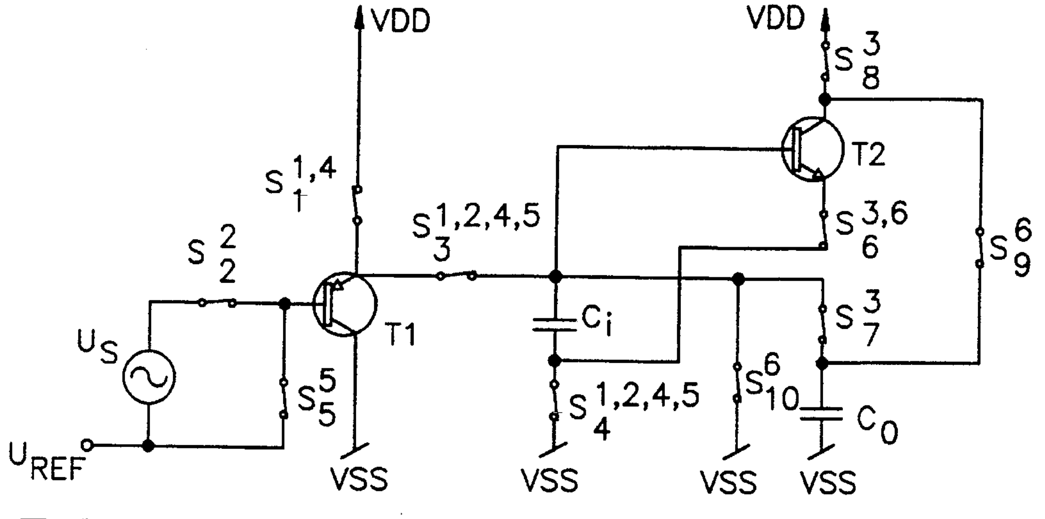
FIG. 8
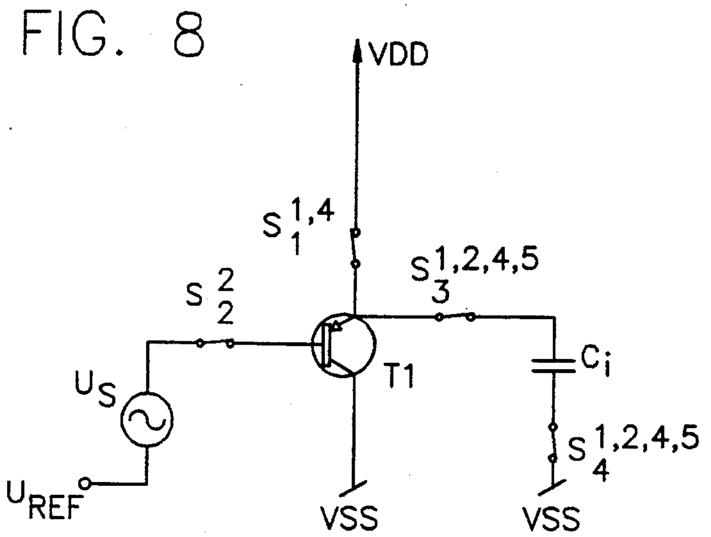
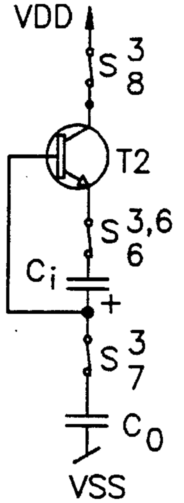
FIG. 10
FIG. 11
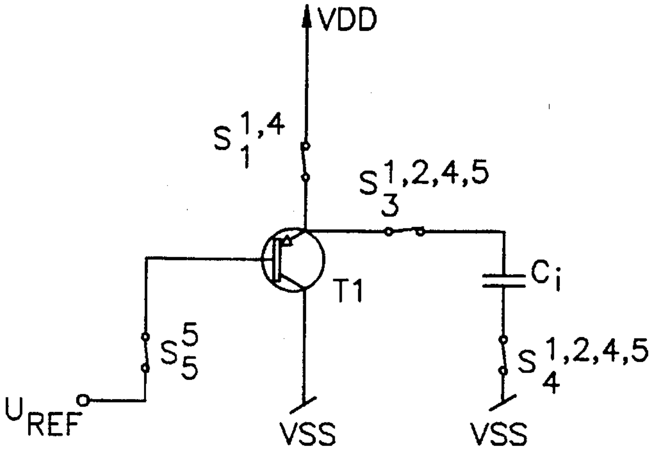
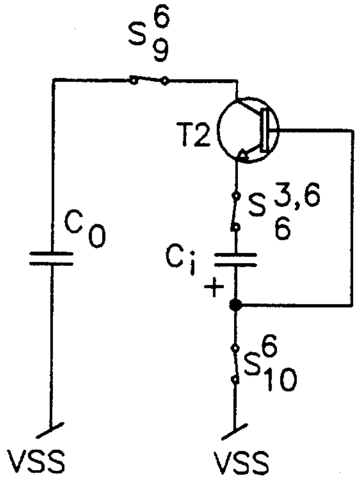
FIG. 12
FIG. 13

METHOD AND APPARATUS FOR PROCESSING SIGNALS

The present invention relates to a method and apparatus for processing signals. In the present context, signal processing refers to addition, subtraction, integration and derivation of the voltage representing the signal, or equally, charge or current.

BACKGROUND OF THE INVENTION

The voltage integrator is an ordinary circuit, implemented for instance in filter structures using the CMOS technique. This is demonstrated by a prior art circuit shown in FIG. 1*a*, being conventionally implemented by means of an operational amplifier. FIG. 1*b* shows an alternative implementation of the state of the art based on the use of capacitors switched in discrete time. The output signal Uo of the integrator shown in FIG. 1*a* is the time integral of the input voltage Ui derived according to the following formula:

$$Uo(t) = -(1/RC)\ {}_o\!\int^t Ui(t)\,dt$$

Similarly, the output signal Uo of the integrator shown in FIG. 1*b* is formed by formula $$Uo(t) = fs\ (Ci/Co)\ {}_o\!\int^t Ui(t)\,dt$$

where fs is the sampling frequency. In the sampling capacitor Ci a charge sample of the input signal is stored when the switches s1 and s4 are closed and the switches s2 and s3 are open. The sample charge (Qi = Ci × Ui) is discharged in the integrating capacitor Co by closing the switches s2 and s3, and the switches s1 and s4 are now open. There may be pauses between the sample storing and sample discharge stages when all four switches s1 to s4 are open.

A drawback related to state of art the circuits is that the amplifier continuously consumer current, this being of an order of magnitude from 50 μA to several 100 μA. Moreover, the amplifier contains a limited bandwidth which is in general proportional to the current consumption, and in a CMOS implementation, harmful 1/f noise. The function of amplifiers such as those shown in FIG. 2 is to transfer a signal charge taken in the sampling capacitor Ci into the integrating capacitor Co. This is implemented when the gain of the amplifier is infinite (in practice thousands or even millions), for which purpose a continuous current flows in the amplifier.

The publication DE-29 33 667 shows a lossy integrator, not consuming static current and corresponding to a passive RC integrator. With such an integrator, merely passive transfer function (i.e., those located on the real axis) can be implemented so that the design disclosed in DE-29 33 667 is not an appropriate element for filters in the transfer function of which complex poles are contained. In publications DE-29 33 667, U.S. Pat. No. 5,021,692, and N. C. Battersby, C. Toumazou: A new generation of class AB switched-current memory for analog sampled-data applications, Proc. ISCAS 1991, designs are disclosed based on current-mode signal processing in which the static current consumption is low. However, each circuit requires a so-called bias-current. For example, U.S. Pat. No. 5,051,692 discloses an integrated circuit provided with a sampling capacitor, which is connected via an active element to be in conductive connection with the supply voltage and which is provided with an integrating capacitor for producing an output signal, but said circuit requires a continuous bias current. Also in publications J. B. Hughes, N. C. Bird, I. C. Macbeth: Switched currents, a new technique for analog sampled data signal processing, Proc. ISCAS 1989 and T. S. Fief, D. J. Allstot: CMOS switched current ladder filters, IEEE JSSC Vol 25 No 6 (Dec 90) illustrate the state of the art is illustrated. Thus, only in Finnish Patent No. 89,838 (corresponding U.S. Pat. No. 5,387,874 and publication EP-473436), has it been possible to eliminate the static current consumption entirely, which feature will be described below for a greater understanding of the present invention.

U.S. Pat. No. 5,387,874 discloses an integration method in which the current consumption is zero. This is reached by using one or two transistors as an active member to control both the taking of a charge sample and transferring it to an integrating capacitor. The other switches required in the operation of the circuit are executed and they are used in a manner known in itself in the art. In the circuit described therein no active continuous-operated amplifier is needed, instead, the transfer of a charge from the sample capacitance to the integrating capacitance is controlled with switching elements, switching one of the sample capacitance terminals to either the positive or the negative supply voltage. At the conclusion of charge transfer, the passage of current totally ends so that the continuous current consumption is eliminated.

According to a preferred embodiment, the integrating capacitance is procharged by connecting it to the positive or negative supply voltage for storing the sample charge.

The method according to U.S. Pat. No. 5,387,874 includes advantageously two charge sample discharging stages, whereby at the first stage a charge sample is conducted to an integrating capacitance only if it has a first sign, i.e. polarity, (e.g. positive or negative), and whereby at the next stage a charge sample is conducted to the integrating capacitance only if it has the opposite sign (polarity, e.g. negative or positive), whereby the first sign has been proselected. The sign of the charge of the sample capacitance can be identified with a comparative circuit member, whereby, depending on the identified sign, only one of the two charge sample discharging stages is carried out.

In an embodiment according to U.S. Pat. No. 5,387,874, a transistor is used as the switching element for discharging a sample charge. In said embodiment, the switching element switching the sampling capacitance to the supply voltage is a bipolar transistor. In an alternative embodiment the switching element is a FET transistor.

In a most preferred embodiment, the switching element is an EPROM-type FET transistor, the floating gate thereof having been arranged to carry a predetermined charge so that the threshold voltage of the FET transistor is of a desired magnitude, most preferably substantially zero. Hereby, the circuit operates almost ideally because e.g., no compensation of the threshold voltages occurring in bipolar transistors is required.

The basic design of the circuit not consuming the static current and of the method, presented in U.S. Pat. No. 5,387,874 is described below more in detail with the aid of embodiment examples, reference being made to the accompanying drawings, in which:

BRIEF DESCRIPTION OF THE DRAWINGS

FIG. 3c, is the voltage graph showing the operation, FIG. 4 shows a simplified circuit diagram of the inverting integrator according to a preferable embodiment of the invention, based on complementary pair and switches, FIG. 5 illustrates the operation of a circuit as shown in FIG. 4, whereby FIG. 5a shows a signal voltage and voltages affecting over the sampling capacitor at various operation stages of the integrating circuit, and respectively, FIG. 5b shows a voltage affecting over the integrating capacitor.

FIG. 2 shows different stages of the method of the invention disclosed in U.S. Pat. No. 5,387,874 by the aid of simplified principle circuit diagrams. In FIG. 2a, a sample from an input signal Us is reserved in a sampling capacitor Ci, being either positive or negative. The sample charge Qi = Us × Ci. For the sake of simplicity, it is assumed that the sampling charge is positive which is indicated by the + sign of one of the capacitor terminals. The other terminal has at this stage been grounded.

Figure 2A:
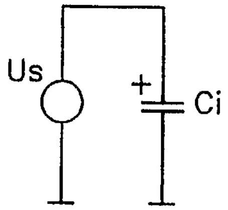
FIGS. 2*a*, 2*b* and 2*c* show the stages of the method of the invention not consuming any static current by the aid of highly simplified principle circuit diagrams.
Figure 2B:
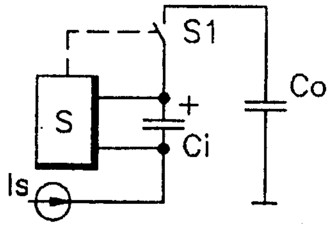

At stage 2 in FIG. 2b the positive charge of the sampling capacitor is discharged into an integrating capacitor Co by connecting the negative terminal of the sampling capacitor (in the present case) to the positive supply voltage +V via supply source Is and the other (positive) terminal to the integrating capacitor Co by closing the switch s1. A detector S is connected over Ci and it keeps the switch s1 closed until the voltage of Ci has reduced to zero, whereby the detector s opens the switch s1. In this manner the charge of the sampling capacitor Ci has been transferred into the integrating capacitor Co. Were the sample charge negative, nothing would take place at this stage. The third stage shown in FIG. 2c has been arranged by connecting the integrating capacitor Ci to the negative supply voltage −V for discharging the negative sample charge- Were the charge positive, nothing would take place at this stage.

Figure 2C:
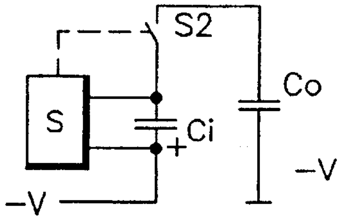

The second (FIG. 2b) stage and third (FIG. 2c) stage of the method shown in FIG. 2 are controlled by detector S ensuring that the charge of the sampling capacitor ci is discharged to a predetermined limit.

The method may be so developed that the above mentioned detector S even as early as at the first stage indicates the polarity of the charge (e.g. positive or negative). Hereby, said second and third stages can be combined, which means that only one of said stages is carried out as expressed by the polarity of the sample charge.

The detector S could be a comparative member operating, e.g., on the basis of operational amplifier, such as a comparator. When implemented in the above manner, the method would not yield a crucially better result than the method shown in FIG. 1b because the noise of said operational amplifier would for instance at very low signals cover the signal.

FIG. 3 shows an implementation of an the method of the invention according to U.S. Pat. No. 5,387,874 by the aid of simplified circuit diagrams with switching elements s11 to s42 and with bipolar transistors T1 to T4 based on BiCMOS techniques. The operation of the integrating circuit is described by the aid of FIGS. 3a, 3b, 3c, 3d, 3e at different stages of the method. All significant components are shown in FIG. 3, but FIGS. 3a, 3b, 3d, 3e show only those components for the sake of demonstration which are essential at each stage. The switching elements included in the circuit are controlled by devices and circuit designs familiar to those skilled in the art, so that said control members are because of clarity omitted. The switching elements are also implementable using devices familiar to those skilled in the art, for instance by mechanical contacts or semiconductor switches.

The operation is described below through six different operation stages. The earth potential is assumed to be zero volt and the polarities of the supply voltages (positive Vd and negative Vs) are produced relative to the earth potential. The signs of the signals and voltages (polarity, e.g., positive Or negative) are indicated relative to the earth potential.

During stage 1 (FIG. 3a) Ci is charged relative to the earth potential into positive supply voltage Vd by closing the switch s10. The rest of the switches are now open. Thereafter, at stage 2 (FIG. 3a) voltage Uci(2) = Us(2) + Ube1 is charged in the sampling capacitor Ci, where Us is the signal voltage and Ube1 the base emitter voltage of the transistor T1 at the moment when current consumption through the transistor T1 stops during stage 1. The marking (2) of the capacitor Ci, in brackets, placed after the voltage Uci, refers to the situation at stage 2 and the plus sign in the drawing refers to the positive terminal of the capacitor at each stage. Below, the other stages are indicated respectively by markings in brackets. The collector of the transistor T1 at stage 2 is connected to the negative supply voltage Ve and the switches s11 and s12 are closed. During stage 2 it is assumed that Us ≧ 0, whereby Uci ≧ Ube1.

During stage 3 (FIG. 3b) the charge of the sapling capacitor Ci is discharged in the integrating capacitor Co by closing the switches s21 and s22 to switch one terminal of the sampling capacitor Ci over transistor T2 to the positive supply voltage Vd. The base of the transistor T2 is connected over the sampling capacitor Ci, whereby the current flow, that is, charge transfer, ends when the voltage affecting over the sample capacitor Ci has reduced to Uci(2) = Ube2, where Ube2 is the base emitter voltage of the transistor T2. At stage 3 an additional charge dQ transferred to the integrating capacitor is therefore (assuming that the base current of transistor T2 at this stage is substantially zero):

$$dQ(3) = Ci\ (Us(2) + Ube1 - Ube2)$$

When the base emitter voltages Ube1 and Ube2 of the transistors T1 and T2 are equal, the circuit integrates the charge dQ(2) = Ci × Us(2) generated by the input voltage Us into capacitance Co.

Figure 3A:
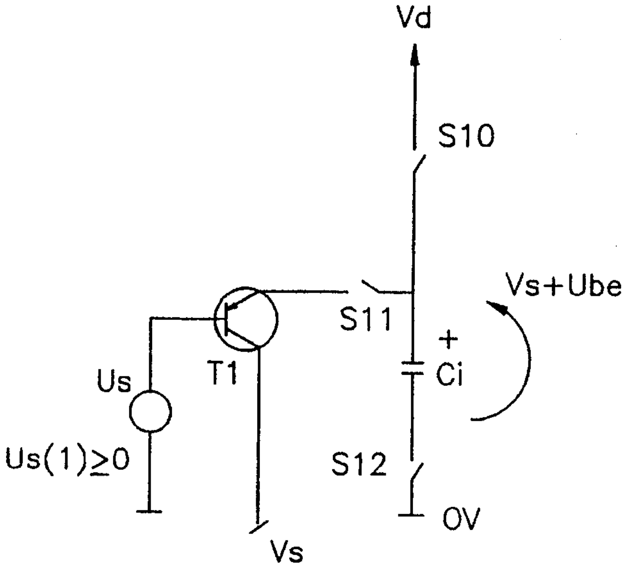
FIGS. 3a, 3b, 3c, 3d and 3e show schematically a practical implementation of voltage integration not consuming any static current by means of bipolar transistors, whereby FIGS. 3a, b, d, e present only the essential components for each operation stage.
Figure 3B:
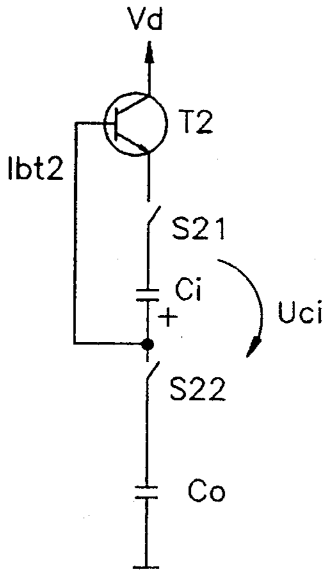
Figure 3C:
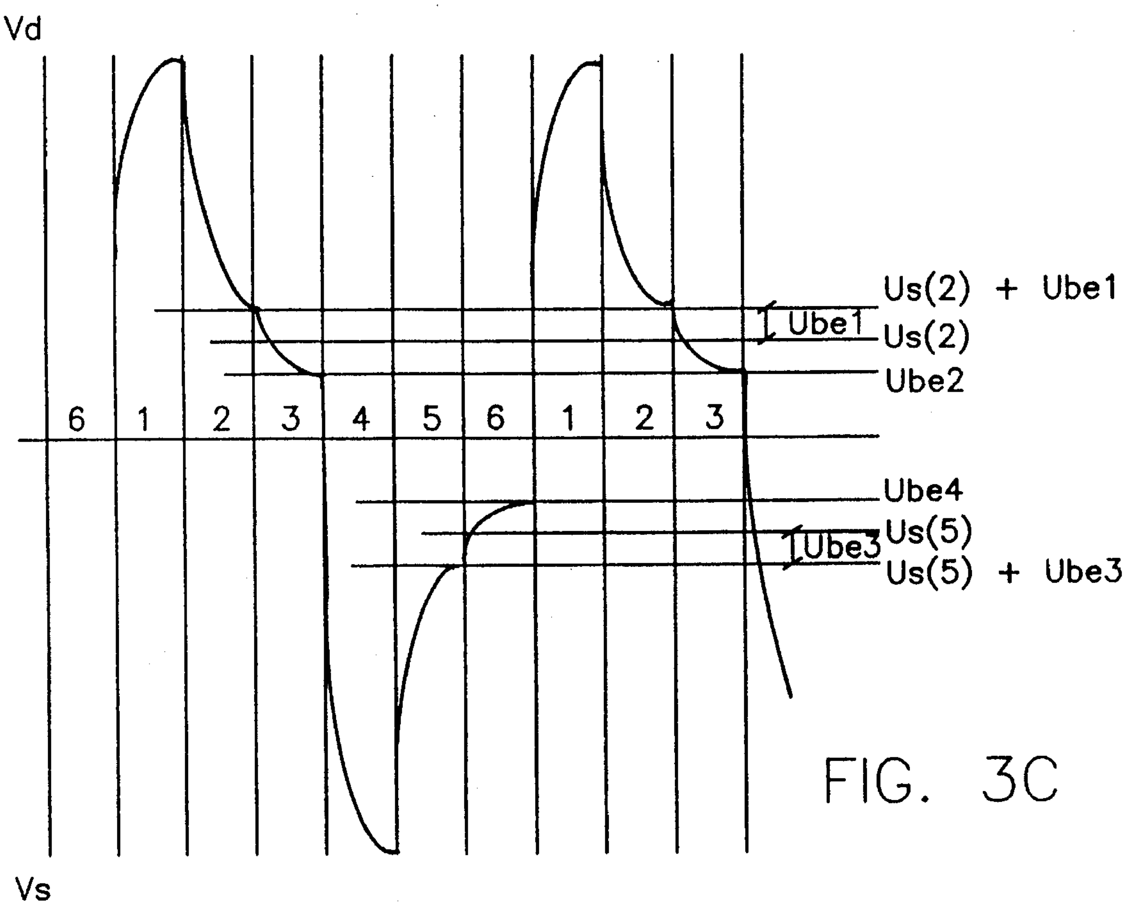
Figure 3D:
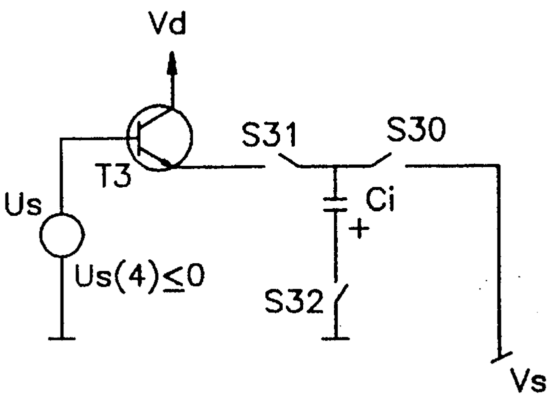
Figure 3E:
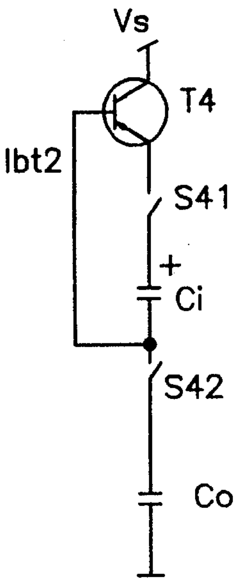

The stages 2 and 3 which in operation correspond to the first and second stages described in relation to FIG. 2 require that the signal voltage Us is positive, because of the polarity of the transistors T1 and T2. Were Us during stage 2 negative, the voltage of Ci remains lower than Ube1, and respectively, during stage 3, lower than Ube2, because of which the transistor T2 remains unconductive during stage 3. Therefore, no charge is transferred to the Co during stages 1 to 3 if Us is negative. The voltage of the sample capacitor Ci during stages 1 to 3 is shown in FIG. 3c.

The negative signal voltage Us is processed at stages 4, 5 and 6, these being equivalent to the first and third stages introduced in FIG. 2. During stage 4 shown in FIG. 3d the capacitor Ci is charged in negative supply voltage Vs. During stage 5 the switches s31 and s32 are closed, whereby the voltage charged into the sampling capacitor Ci is Uci(3) = Us − Ube3, where Ube3 is the base emitter voltage of transistor T3. At stage 6 (FIG. 3*e*) the switches s41 and s42 are closed, whereby the charge of the sampling capacitor Ci is discharged to the integrating capacitor Co, and transistor T4 has been connected to the negative supply voltage Vs. At the conclusion of discharge, the base emitter voltage ube4 remains in the capacitor Ci, hence the charge transferred into the integrating capacitor is $$dQ(6) = Ci\ (Us(5) - Ube3 + Ube4)$$

When the base emitter voltages Ube3 and Ube4 of the transistors T3 and T4 are equal, the circuit integrates the charge Ci. Us(5) corresponding to the input voltage Us(5) into the capacitance Co. Respectively, as during stages 1 to 3, no charge is transferred into the integrating capacitor Co at stages 4 to 6 if the signal voltage Us is positive. The integrating circuit shown in FIG. 3 is preferable in that it consumes current only when sample charges are stored and discharged at stages 1 to 6. There may be pauses between the stages during which the circuit does not consume any current. In the implementation of the circuit like the one shown in FIG. 3 care has to be taken that the base emitter voltages of the transistor pairs T1/T2 and T3/T4 are selected to be equal. Similarly, the circuits must be so dimensioned that the base currents of the transistors T2 and T4 controllably generate charging and discharging of the sampling capacitor Ci. The last mentioned factor has on the basis of the tests been estimated to exert a diminishing effect on the integration coefficient (order of magnitude less than 1%). The charge of the integrating capacitor Co is not affected by said base currents.

It is useful to examine the effect of the balance of said base emitter voltages in such a situation in which the input signal Us = 0, as shown in FIG. 3. In this case, the charge $$\begin{aligned} dQp &= Ci \cdot (Ube1 - Ube2), && \text{if } Ube1 > Ube2 \\ &= 0 && \text{if } Ube1 \leqq Ube2 \end{aligned}$$

is added to the integrating capacitor Co during the stages 2 and 3 and respectively, during the stages 4 and 5, the charge $$\begin{aligned} dQn &= -Ci \cdot (Ube3 - Ube4), && \text{if } Ube3 > Ube4 \\ &= 0 && \text{if } Ube3 \leqq Ube4 \end{aligned}$$

is added to Co.

As shown in FIG. 3, the base emitter voltage Ube1 is in the direct integrator approximately equal to Ube4, and respectively, Ube2 is approximately equal to Ube3; hence, of the above-presented charge differences dQn, dQp, only one is integrated together with the signal value to the integrating capacitor Co. Therefore, asymmetric non-linearity may occur in said integrator if the base emitter voltages in said pairs are different from one another.

By changing the order of performance of the stages 3 (FIG. 3*b*) and 6 (FIG. 3*e*) of the circuit shown in FIG. 3, an inverted integrator is obtained. Hereby, Ube1 = Ube2 and Ube3 = Ube4 when no non-linearity mentioned above occurs in the inverted integrator. The direct integrator is presented in its entirety in FIG. 4 wherein by the aid of switches, the transistors T1 and T3, and transistors T2 and T4, have been combined into transistors T5 and T6. The samples taken from the input signal Us are at different stages conducted via transistor T5 or T6 into the sampling capacitor Ci, and therefrom further to the integrating capacitor Co via the same transistor T5, resp. T6.

To fully understand the operation of the integrating circuit shown in FIG. 4, the operation of the switches is indicated in the table below at stages 1 to 6 controlled by the preselected operation frequency of a clock circuit (not shown). The state of the switches during each stage is presented in the following table in which the sign x refers to a closed switch and the blank to an open switch.

| | Stages | | | | | | |
|---|---|---|---|---|---|---|---|
| Switch | 1 | 2 | 3 | 4 | 5 | 6 | 1 |
| s51 | x | x | | x | x | | x |
| s52 | x | | | | | | x |
| s53 | | x | | | | | |
| s54 | | x | | | | | |
| s55 | | | | | | x | |
| s56 | | | x | | | x | |
| s57 | | | | | | x | |
| s62 | | | | x | | | |
| s63 | | | | | x | | |
| s64 | | | | | x | | |
| s65 | | | x | | | | |
| s67 | | | x | | | | |

At stage 2 a sample of the input signal Us is read via switch s54, transistor T5 and switch s53 into the sampling capacitor Ci, one terminal thereof being grounded via switch 51. At stage 3, the sample is discharged into the integrating capacitor Co so that the capacitors are switched together with switch s56. The other terminal of the capacitor Ci is connected via switch s63 and transistor T6 to the positive supply voltage Vd. Discharging of Ci is continued until the voltage of Ci of the capacitor Ci reaches the base emitter voltage of transistor T6 since the base of the transistor T6 is now via switch s65 connected to a point between the capacitors Ci and Co. At stage 4, the sampling capacitor Ci is precharged to the negative supply voltage Vs. At stages 5 and 6, the sample is read and discharged as above but now via transistor T6. At stage 1 the capacitor Ci is recharged to the positive supply voltage, whereby a new cycle starts again.

The operation of the circuit according to FIG. 4 is also demonstrated in FIGS. 5*a* and 5*b* where the relationships between the input signal Us, the voltage Uci affected over the sampling capacitor Ci and the voltage Uco affected over the integrating capacitor co are presented at time intervals as a function of time. On the time axis between FIGS. 5*a* and 5*b* is marked the order of stages 1 – 6. FIG. 5 is intended for clarifying the operation principle, therefore the voltage graphs are not on exact scale. It is seen that the output voltage Uco (FIG. 5*b*) integratingly follows the input signal Us (FIG. 5*a*).

From the circuit shown in FIG. 3 a simple full wave rectifier is obtained in that instead of stage 6 (FIG. 3*e*), stage 3 is performed (FIG. 3*b*), and the integrating capacitor co is set to zero prior to each integration stage unless an integration of the rectified voltage is wanted. Inversing of stages 3 and 6 may also be carried out in reveres order, i.e. instead of stage 3, stage 6 is performed. The circuit may also be transformed into an amplifier in a very simple manner.

Since in the circuit of FIG. 4 the discharge and charge stages are implemented in one and same transistor T5, resp. T6, an invidual sample is free from potential non-ideal features found in association with FIG. 3. Careful endearours have to be made, however, in producing the circuit to provide insure that the base emitter voltages of PNP / NPN transistors T5, T6 are identical since otherwise uncertainties may occur in the proximity of the zero crossover points of the signal, i.e. repetition of the voltage difference in one direction only.

Figure 6:
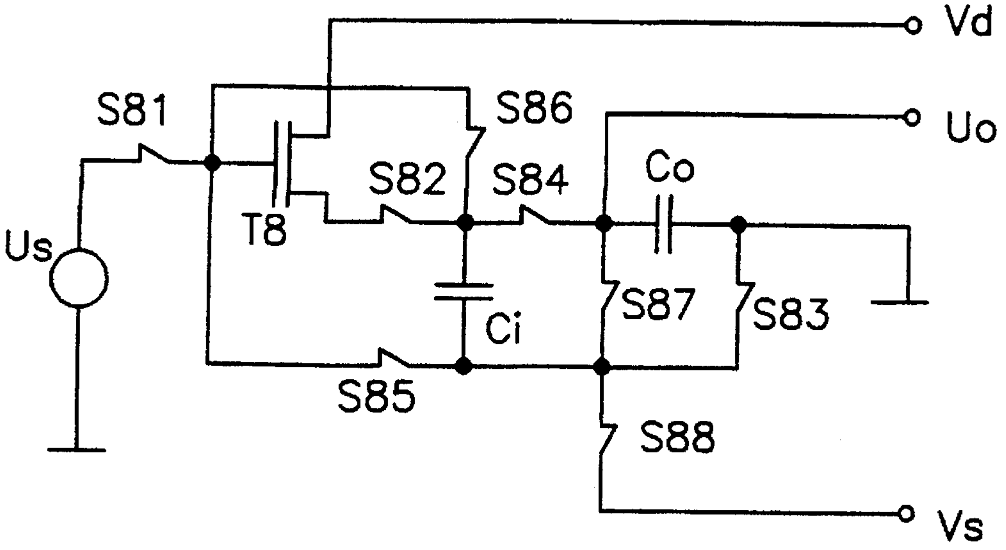
FIG. 6 presents a simplified circuit diagram of an inverting integrator as shown in FIG. 4 where for the integration cell an ideal CMOS switch is used.

The inverting integrator shown in FIG. 6 is based on the use of a CMOS transistor. A sample from the input signal Us is by the aid of transistor T8 and swatches s81 to s88 read into the sampling capacitor Ci. The sample is then transferred to the integrating capacitor Co, one of the terminals thereof being fixedly connected to the output where the inverted, integrated output signal Uo is obtained. The other terminal S (FIG. 7) of the transistor T8 is connected to the positive supply voltage Vd.

In the switch table below, describing the operation of the circuit shown in FIG. 6, x at each stage 1 to 4 refers to a closed switch. At non-marked stages the switch is open.

| Switch | Stages 1 | 2 | 3 | 4 |
|---|---|---|---|---|
| s81 | x | | | |
| s82 | x | | | |
| s83 | x | | | |
| s84 | | x | | |
| s85 | | x | | x |
| s86 | | | x | |
| s87 | | | x | |
| s88 | | | | x |

Figure 7:
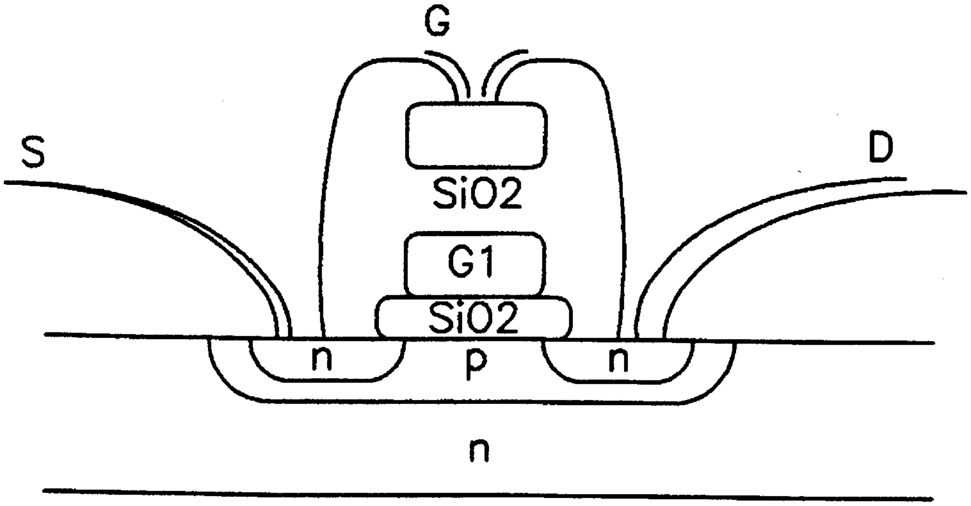
FIG. 7 presents schematically the principle design of the ideal switch of FIG. 6 when implemented in the form of EPROM transistor.

The operation of the circuit shown in FIG. 6 is different from the one shown in FIG. 5 in that both the positive and negative samples are processed at the same sampling stage. Stage 1 includes sample storing in the capacitor Ci, stages 2 and 3 include the discharge of the sample, dependent on the polarity of the sample, in the capacitor co, and stage 4 concerns the charging stage of the floating gate G1 of the transistor T8 (FIG. 7). At the charging stage, on the floating gate G1 of the transistor T8 is arranged a predetermined charge which in the case shown in FIG. 6 is carried to the gate G (FIG. 7) from the earth potential.

The transistor T8 shown in FIG. 6 is provided with a slightly out of ordinary structure described briefly by the aid of FIG. 7. The purpose of the figure is merely to demonstrate the principle structure with a strongly enlarged schematical cross-section; hence, the size proportions and dimensions of different parts are not realistic. The transistor is produced using, e.g., the EPROM process known in the art, and the transistor shown in FIG. 7 is known in itself to a person skilled the art. The CMOS transistor of FIG. 7 is provided with the following terminals: source S, drain D and gate G. Isolated between the gate G and base SUB is positioned the floating gate G1. At the charge stage 4 shown in FIG. 6 on the floating gate G1 a predetermined charge has been arranged. Due to said floating gate, asymmetries possibly caused by conventional bipolar and FET transistors are avoided in the integrating circuit. A person skilled in the art comprehends, with the aid of the figure, the rest of the principle structure of the transistor and the other features of its operation. The transistor according to FIG. 7 may also be used in integrating circuits like those shown in FIGS. 2, 3 and 4, whereby their potential asymmetries will respectively be changed. The circuit shown in FIG. 6 is, however, considered more preferable because the number of the switching elements requires less than in circuits 2, 3 and 4.

With the aid of the circuits disclosed in U.S. Pat. No. 5,387,874 and in the present context, filters, rectifiers, modulation detectors and other signal processing circuits can be implemented. The operation of the circuits requires an equal size of the base emitter voltages Ube1 and Ube2 of the PNP and NPN transistors, which is possible to obtain especially in the case when a circuit is implemented to be one integrated circuit.

A great advantage of the integrating circuits described above is that they do not consume any static current. In addition, the circuits have only a small noise level and a wide dynamics range. The circuits in an integrating circuit acquire only half of the space of what the designs known in the art require. Due to said details, the present circuits are ideal for small portable appliances, such as data detection and data filtering circuits of radio paging apparatus, speech processing circuits or data modem circuits of radio telephones, and in other micro power applications.

As shown in the above description, a potential limitation of the circuits and the method disclosed in U.S. Pat. No. 5,387,874 is, however, that the signal processing is dependent on the polarity (positive or negative) of the input signal voltage so that different stages have to be arranged for transferring the charge with another sign (positive or negative), as at stages 2 and 3 described in association with FIG. 2. Hence, there is a drawback, as described in relation to FIG. 3, that if the threshold voltages of the transistors used as active members differ from one another, asymmetric non-linearity may occur in the integrator because the positive and negative signal voltage are processed in different transistors.

SUMMARY OF THE INVENTION

In accordance with the invention there is provided a circuit for processing a signal comprising: a sampling capacitance; a storing capacitance; means for providing an input signal; means for summing the input signal with a predetermined reference signal selected to provide a sum signal that is bounded on one side by a predetermined limiting value; and means for transferring a quantity of charge representative of the sum signal onto the sampling capacitance, a quantity of charge representative of the charge transferred to the sampling capacitance to the storing capacitance, a quantity of charge representative of the reference signal to the sampling capacitance, and a quantity of charge of equivalent magnitude and opposite polarity to the quantity of charge transferred to the sampling capacitance representative of the reference signal to the storing capacitance.

One embodiment of the invention is based on the idea that one or two transistors are employed as the active members of the entire circuit which can be current controlled (bipolar) or voltage controlled (FET) transistors, the charge passing therethrough being controlled by the transferrable charge itself, in addition to the switches, in that after transferring the charge, all passage of the current in the circuit ends by itself. Therefore, the circuit acquires, during the transmission stages, a charge to be transferred from the supply voltages thereof and proportional to the sample charge, consequently, the circuit includes no continuous current consumption. Besides, the signal processing is linear irrespective of both the polarity (positive or negative) of the signal and the threshold voltages of the transistors.

The operation of the circuit is accomplished by producing an input signal voltage relative to a reference voltage of predetermined magnitude and by taking sample charges from the sum of the input signal voltage and the reference voltage into a sampling capacitor and by transferring said sample charges into an integrating capacitor, and thereafter, sample charges are taken from said reference voltage ef predetermined magnitude into the sampling capacitor, and said sample charges are added into the integrating capacitor opposite in polarity to the charge already provided therein. The reference voltage of predetermined magnitude is selected to be either positive or negative, to be higher in absolute value than the signal voltage so that the sum of the signal voltage and the reference voltage always has the same polarity as the reference voltage, irrespective of the value of the signal voltage. Thereby it is ensured that the sample charges are always taken from a signal with a predetermined polarity, and it is not necessary to process in the same circuit positive and negative signal voltages separately, as disclosed in U.S. Pat. No. 5,387,874. When sample charges taken from the reference voltage are summed in the integrating capacitance at a later stage, as mentioned above, which are different in polarity compared with the charge samples charged earlier in the integrating capacitor, the effects of both the reference voltage and the threshold voltages of the transistors are eliminated from the transfers of the charge, and a signal voltage processed by the circuit is obtained for the output.

In accordance with one embodiment of the invention there is provided a method in which a sapling capacitance is switched selectively into functional connection with a signal voltage, and a quantity of charge samples proportional to the signal voltage are stored in the sampling capacitance during the period of time when the sampling capacitance is in functional connection with the signal voltage. Switching elements are switched at predetermined time intervals for connecting selectively sampling capacitance into functional connection with the integrating capacitance, and charge samples are transferred from the sampling capacitance into said integrating capacitance being in functional connection therewith. The timing of the switching elements is selected and the switching is performed so that current flow ends by itself in the entire circuit after taking or transferring the charge sample. The operation is characterized in that, the signal voltage is produced relative to a reference voltage of predetermined magnitude so that the sum of the signal voltage and said reference voltage is produced, and that, irrespective of variations of the signal voltage, the polarity of said sum is always the same as the polarity of the reference voltage. Also when charge samples proportional to the signal voltage are taken, a quantity thereof is taken, which is proportional to said sum of the signal voltage and the reference voltage, and after the charge samples proportional to the sum of said signal voltage and said reference voltage have been transferred from the sampling capacitance into the integrating capacitance, a quantity of charge samples proportional to the reference voltage is added into the integrating capacitance with an opposite polarity relative to the polarity of the charge samples proportional to said sum.

Adding the charge samples proportional to the reference voltage into the integrating capacitance opposite in polarity relative to the polarity of the charge samples transferred earlier thereto may comprise the following stages:

- the sampling capacitance is switched selectively into functional connection with said reference voltage,
- a quantity of charge samples proportional to said reference voltage is stored in the sampling capacitance during the time when the sampling capacitance is in functional connection with said reference voltage,
- switching elements are switched at predetermined time intervals for connecting selectively the sampling capacitance into functional connection with the integrating capacitance,
- a quantity of charge samples proportional to the reference voltage are transferred opposite in polarity relative to the polarity of the charge samples present in the integrating capacitance from the sampling capacitance to said integrating capacitance being in functional connection therewith, and
- also the timing of said secondly mentioned switching elements is selected, and the switching is so performed that current flow stops by itself in the entire circuit after taking or transferring the charge sample.

The charge samples proportional to the sum of the signal voltage and the reference voltage and the charge samples proportional to the reference voltage may be stored in the sampling capacitance by connecting selectively said voltages to be sampled at each moment to a controlling electrode of a transistor controlling the sampling connected between said voltages to be sampled and the sampling capacitance, and said sampling capacitance being via the transistor in functional connection with a supply voltage, whereby said charge samples are stored in the sampling capacitance from the supply voltage, and the transfer of said charge samples into the sampling capacitance ends by itself when the voltage of the electrode of the sampling capacitance in functional connection with the current supplying electrode of the transistor differs from the voltage conducted to the controlling electrode of said transistor by the amount of the threshold voltage of the transistor.

Prior to storing charge samples in the sampling capacitance the capacitance may be precharged to be in such voltage that the voltage difference of the voltage connected at each moment to the controlling electrode of the transistor controlling the sampling and of the voltage of the electrode in functional connection with the current emitting electrode of the transistor controlling the sampling of the sampling capacitance is at the moment of starting the charge sampling the same in polarity as and higher in value than the threshold voltage of said transistor controlling the sampling.

Prior to storing the charge samples in the sampling capacitance, the capacitance may be precharged to be in the threshold voltage of the transistor controlling the transfer of the charge samples from the sampling capacitance to the integrating capacitance.

The charge samples may be transferred from the sampling capacitance to the integrating capacitance being in functional connection therewith by the aid of a transistor connected to each capacitance by connecting the voltage affected over the sampling capacitance between the controlling electrode and the current emitting electrode of the transistor, whereby the transfer of the charge samples into the integrating capacitance stops by itself when the voltage affected over the sampling capacitance is reduced to the threshold voltage of the transistor.

The signal processing circuit according to one embodiment of the invention is furthermore characterized in that the current derived from the supply voltage is in magnitude equivalent only to the charge to be transferred.

One embodiment of the present invention ie disclosed here for processing a signal (voltage) so that no static current passes from a supply voltage through the circuit, as takes place in most prior art circuits in which some component continuously needs a bias current. Signal processing in the context of this invention means amongst other things addition, difference, integration and derivation of the voltage of a signal, or, quite equally, of charge or current, these being the basic operations, and the circuits performing said operations are basic elements in producing various filters or other signal processing structures. The method and signal processing circuit of an embodiment of the present invention intended for implementing signal processing that does not consume any static current is introduced by the aid of the integrating circuit.

It is assumed in the description that the signal and reference voltages have been so determined that the lower supply voltage VSS is assumed to be the zero potential. On the basic of the description, the respective operations can be implemented by maintaining the higher supply voltage as the zero potential and the lower supply voltage VSS as negative, though said exceptional case is not dealt with separately.

BRIEF DESCRIPTION OF THE DRAWINGS

Figure 9:
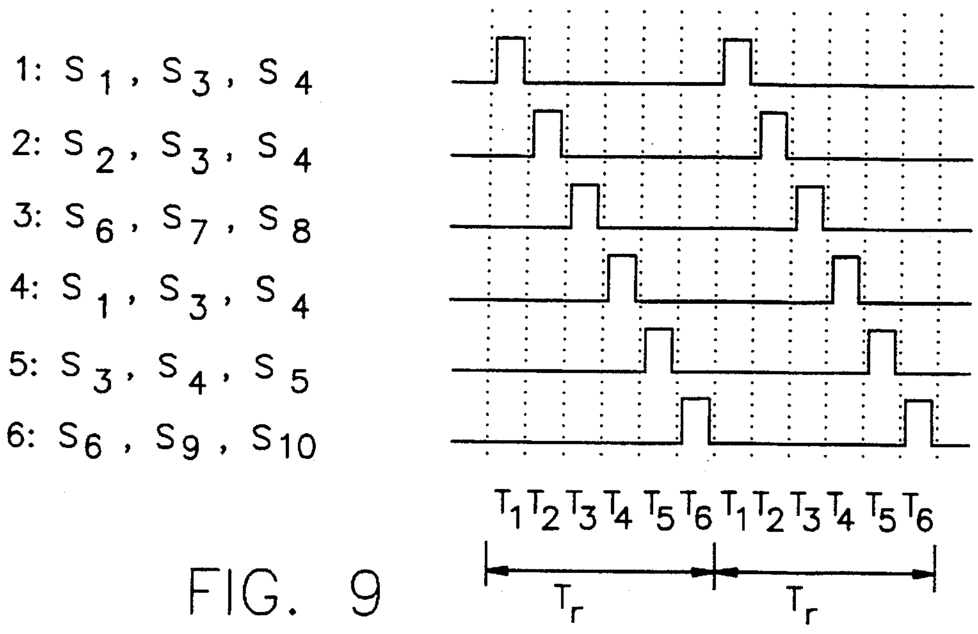
Figure 15:
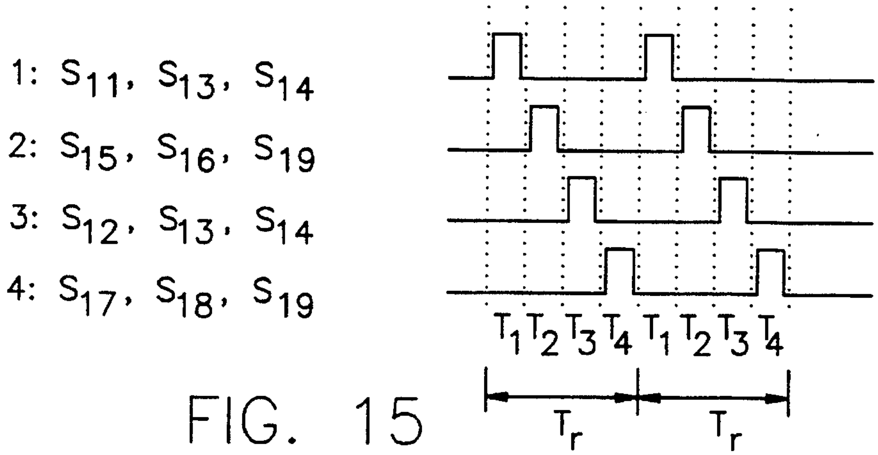
Figure 17:
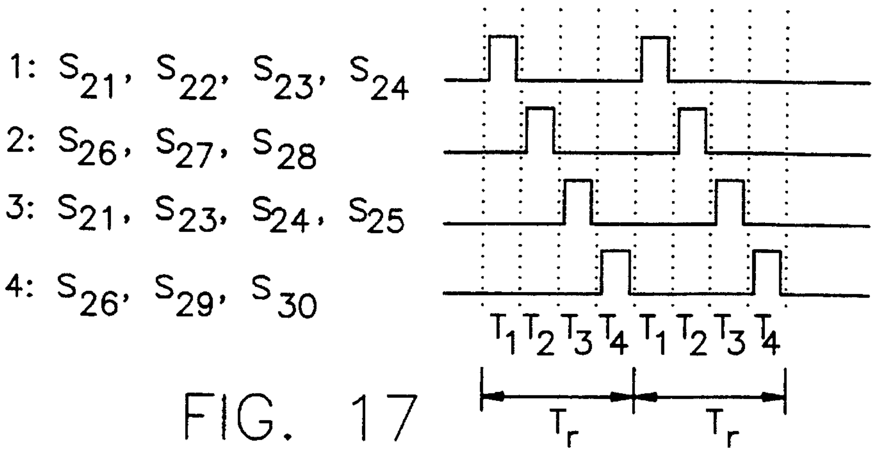
Figure 14:
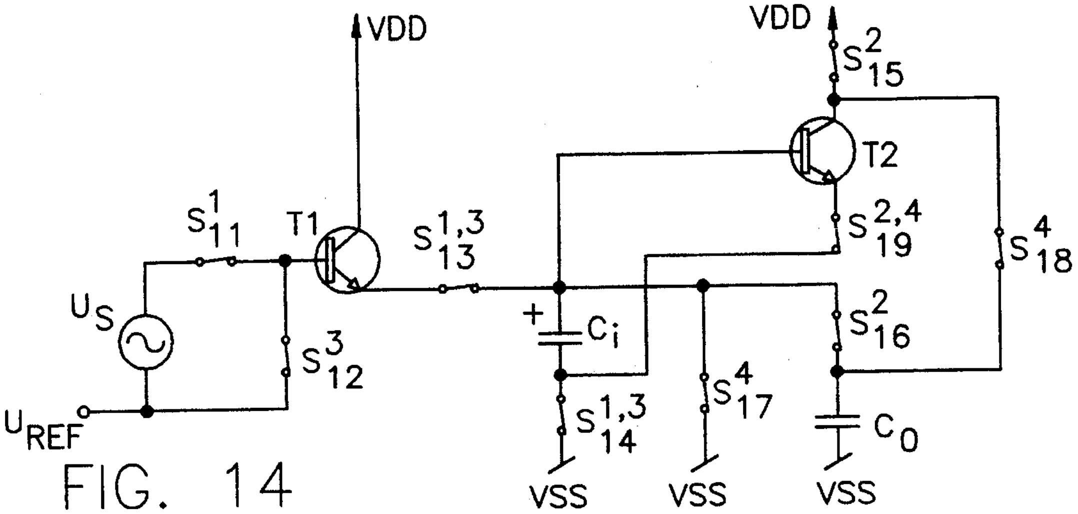
Figure 14A:
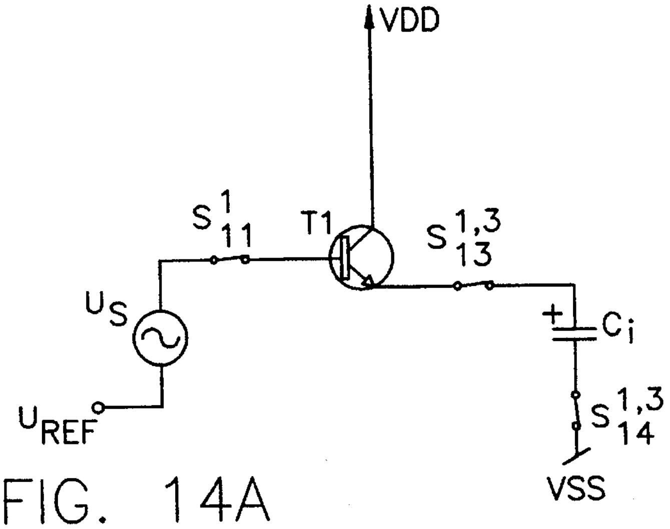
Figure 14B:
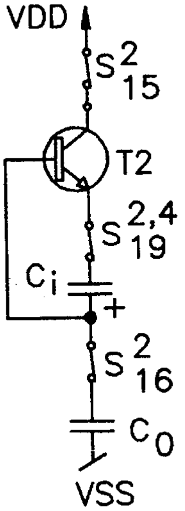
Figure 14C:
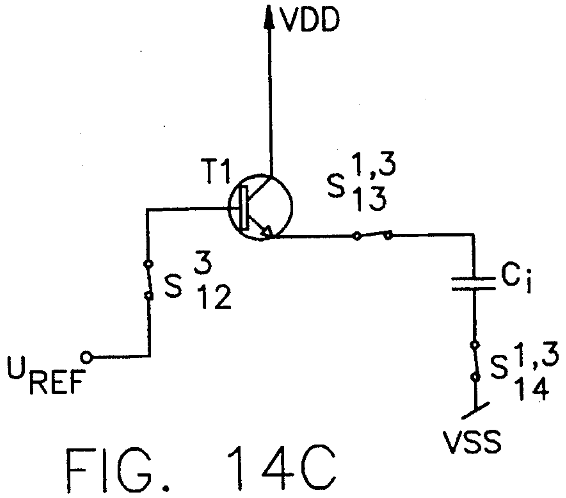
Figure 14D:
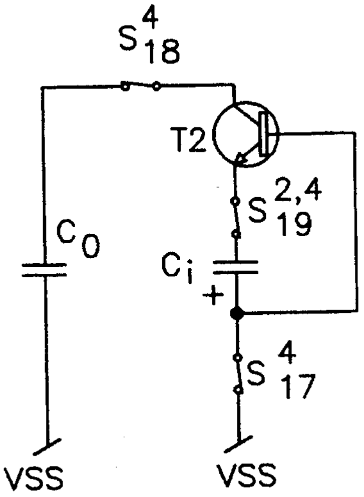
Figure 16:
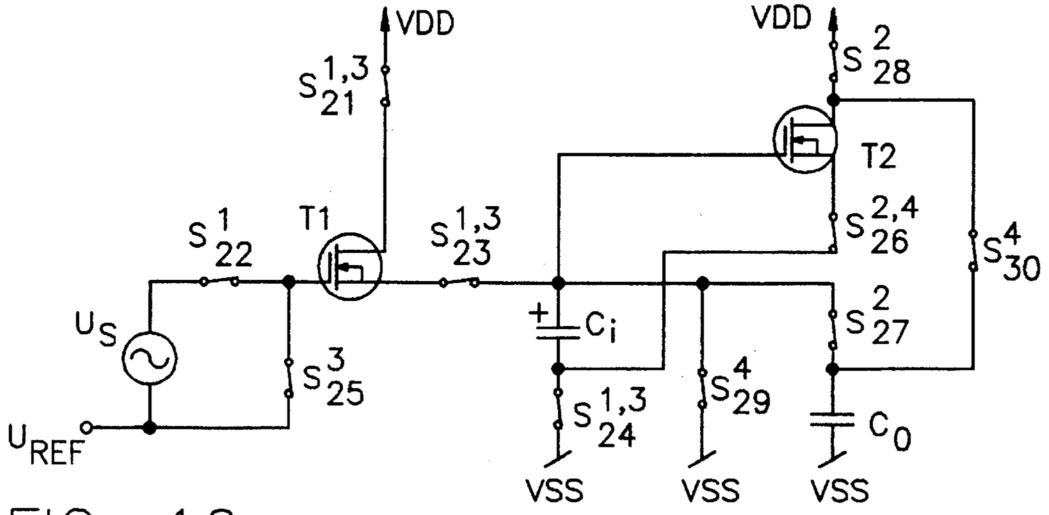
Figure 18:
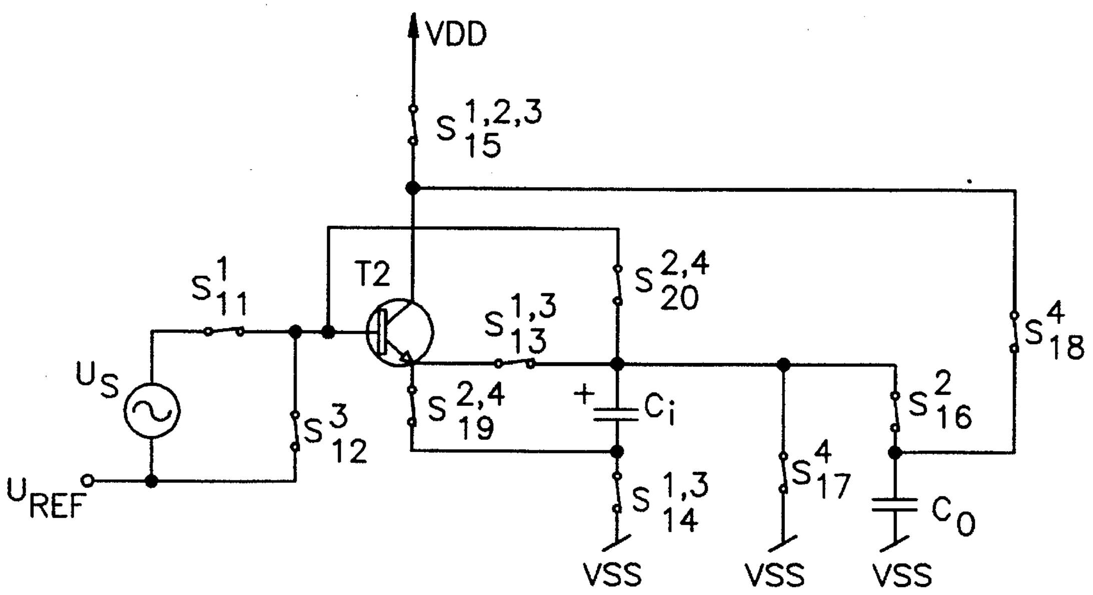
Figure 19:
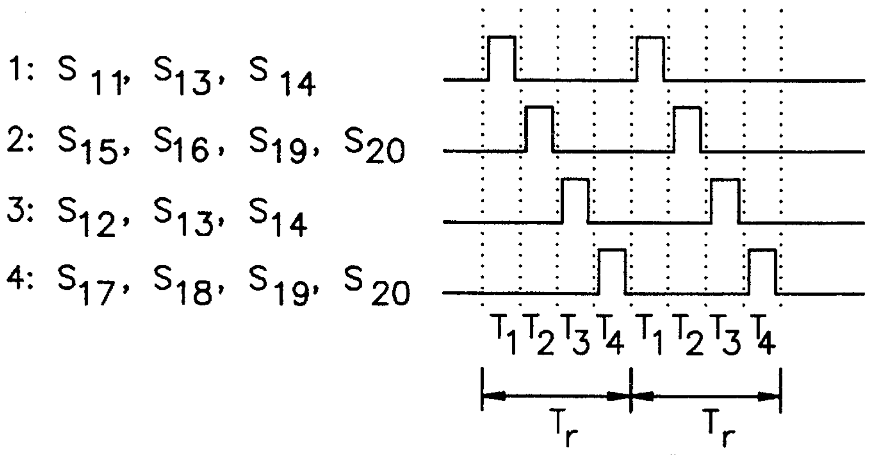

The invention is described below in greater detail, reference being made to the accompanying drawings, in which FIG. 8 presents an integrating circuit of the invention in its entirety, FIG. 9 presents, by way of an example, the operations of the circuit as in FIG. 8 at different clock stages in tabulated form, FIG. 10 presents reduced the essential parts associated with the operation of the circuit of FIG. 8 during clock stages 1 and 2, FIG. 11 presents reduced the essential parts associated with the operation of the circuit of FIG. 8 during clock stage 3, FIG. 12 presents reduced the essential parts associated with the operation of the circuit, as shown in FIG. 8, during clock stages 4 and 5, FIG. 13 presents reduced the essential parts associated with the operation of the circuit, as shown in FIG. 8, during clock stage 6, FIG. 14 presents a second embodiment of the invention, FIG. 14*a* presents the parts associated with the sampling from the input signal shown in FIG. 14, FIG. 14*b* presents the parts associated with the transfer of signal charge into the integrating capacitor of FIG. 14, FIG. 14*c* presents the parts associated with the sampling from the reference voltage of FIG. 14, and FIG. 14*d* presents the parts associated with the transfer of the charge samples of the reference voltage shown in FIG. 14 into the integrating capacitor, FIG. 15 presents clock staging shown in FIG. 14, FIG. 16 presents the voltage integration method according to the invention, implemented in MOS transistors, and FIGS. 16*a* to 16*d* present the parts associated with operation of each clock stage of the circuit shown in FIG. 16 during four different clock stages, FIG. 17 presents the clock staging shown in FIG. 16, FIG. 18 shows the design of the invention implemented with one transistor, and FIG. 19 presents the clock staging of FIG. 18.

DETAILED DESCRIPTION OF THE INVENTION

The method according to an embodiment of the invention comprises a signal voltage Us produced relative to a reference voltage $U_{Ref}$ predetermined magnitude, and alternate adding of said reference voltage $U_{Ref}$ with at least one transistor. In FIG. 8, this is illustrated by the aid of transistors T1 and T2 so that the end result ie a time-discrete integral from the voltage ($U_s$-$U_{Ref}$), totally irrespective of how high the threshold voltages Uth1 and Uth2 of the switch transistors T1 and T2 are. FIG. 8 shows a circuit for implementing the method of the invention which is clocked by the aid of clock signals as those shown in FIG. 9. FIG. 9 shows that for various stages 1 to 6, the switches of the circuit of FIG. 8 are closed and opened by the aid of clock pulses as those in FIG. 9, these being so-called non-overlapping clock pulses, i.e., during a given stage only the switches intended to be closed during said stage are conductive, and the other switches are open. The operation of various clock stages of the circuit is described in detail in FIGS. 10 to 13, in which only the elements required for each operation are included from FIG. 8. The switches are marked below by capital S and indices so that the subscript refers to the numeral of the switch, this being running, and the upper script refers to the clock stage during which the switch is conductive. Respectively, the upper index of the voltages refers to the clock stage, to which the value of said voltage conforms. Thus $U^2{}_d$ refers to the voltage of capacitance $C_i$ during clock stage 2. The switching elements included in the circuit are controlled by devices and circuit designs known in themselves to a person skilled in the art; therefore, said control elements have, for the sake of clarity, been omitted. Also the switching elements can be implemented by the aid of devices known to persons skilled in the art, e.g., by the aid of mechanical switches or semiconductors. The signs of the signals and voltages (polarity, e.g., positive or negative) are detected relative to the earth potential.

FIG. 10 presents the operation during clock stages 1 and 2. During clock stage 1, the switches $S_1$, $S_3$, and $S_4$ are closed, so that the charge transferring capacitor $C_1$, here also called sampling capacitor $C_i$, is charged into higher (positive) supply voltage VDD after having been at voltage Uth2 after clock stage 6 of the preceding clock signal repetition stage $T_r$ (cf. Table 1 below). At clock stage 2, the switches $S_2$, $S_3$ and $S_4$ close, and the capacitor $C_1$ transferring the charge is connected via the transistor T1 to the input signal voltage $U_s$ relative to the reference voltage $U_{Ref}$, whereby the sampling capacitor $C_1$ is discharged from the voltage VDD into the voltage $$U^2{}_{Ci} = U^2{}_S + U_{Ref} + Uth1 \quad (1)$$

and the discharging of the sampling capacitor $C_1$ ends after the emitter voltage of the transistor T1 (and the voltage affected over the sampling capacitor $C_i$) has reduced to differ, by the amount of the threshold voltage Uth1 from the voltage ($U_s + U_{Ref}$), as according to formula (1). When the current gain of transistor T1 is large, the charge transferring to the sampling capacitor $C_i$, or discharging therefrom, comes entirely from the supply voltage VDD of the circuit, and not from the signal voltage $U_s$.

The operation at the subsequent clock stage is presented in FIG. 11. During clock stage 3 the switches $S_6$, $S_7$ and $S_8$ are conductive (closed), whereby the positive terminal of the sampling capacitor $C_i$ supplies base current to transistor T2 until the sampling capacitor $C_i$ has discharged as far as the threshold voltage Uth2 of the base emitter junction of the transistor T2. Now the summing capacitance $C_o$, called here also integrating capacitor $C_o$, is charged from the upper (positive) supply voltage VDD across the sampling capacitor $C_i$ and the discharge current of the sampling capacitor $C_i$ is transferred into the charge summing capacitance $C_o$, whereby during clock stage 3 the charge $$\Delta Q_3 = C_i\,(U^2{}_S + U_{Ref} + Uth1 - Uth2) \quad (2)$$

is transferred from the charge transferring capacitor $C_i$ into the charge summing capacitor $C_o$.

During clock stage 4 (FIG. 12) the switches $S_1$, $S_3$, $S_4$ are closed again, whereby the sampling capacitor $C_i$ is charged again to the higher (positive) supply voltage VDD, as was the case at stage 1. During clock stage 5 the switches $S_3$ and $S_5$ are closed, whereby the sampling capacitor $c_i$ is via transistor T1 connected to the reference voltage $U_{Ref}$, and the sampling capacitor $C_i$ is discharged from the voltage VDD into the voltage $$U^5_{Ci} = U_{Ref} + Uth1 \quad (3)$$

During the last clock stage 6 the switches $S_6$, $S_9$ and $S_{10}$ are closed, whereby the sampling capacitor $C_i$ supplies base current to transistor T2 until it has discharged to the threshold voltage Uth2 of the base emitter junction of transistor T2 (FIG. 13). Thus a negative charge is transferred to the integrating capacitor $C_o$, whereby it is discharged into the lower supply voltage VSS (which can be 0 v or negative) through the sampling capacitor $C_i$. The charge summed in the integrating capacitance $C_o$ during clock stage 6 is $$\Delta Q^6 = -C_i(U_{Ref} + Uth\mathbf{1} - Uth\mathbf{2}) \quad (4)$$

When the current gain of the transistor T2 is large, as it is in a good-quality bipolar transistor, or infinite, as in a PET-affected transistor (e.g., MOS transistor), also the charge transferring at the charge transfer stages comes from the supply voltage (VDD, VSS) and precisely of the magnitude as the transfer of desired charge from the sampling capacitance $C_i$ to the integrating capacitance $C_o$ requires. During all clock stages 1 to 6 the charge transferred from the input of the circuit to the output in the integrating capacitor $C_o$, totals in the sum of formulae (2) and (4), that is, $$\Delta Q_{1ot} = C_i\,(U_s + U_{Ref} - U_{Ref}) = C_i\,U_s \quad (5)$$

or respectively, during one clock stage repetition stage Tr (FIG. 9), that is, during clock stages 1 to 6, the voltage of the integrating capacitor $C_o$ changes value according to the formulae (6):

$$\Delta U_{C_0} = \frac{C_i}{C_0}\,(U_S + U_{Ref} - U_{Ref}) = \frac{C_i}{C_0}\,U_S \quad (6)$$

Thus, from the circuit as shown in FIG. 8 a discrete-time integrating circuit of the signal voltage is produced, the weight coefficient of the integration whereof being $C_i/C_o$. Although the individual clock stages 1 to 6 of the integration are limited regarding the sign of the voltages to be connected, by means of a charge addition corresponding to the sum of the signal and reference voltages, as taught by the invention, and by the reduction of the charge corresponding to the reference voltage to be performed thereafter, both positive (i.e., voltages $U_s + U_{Ref}$, which are higher than the reference voltage $U_{Ref}$) and negative signal voltages $U_s$ (that is, voltages $U_s + U_{Ref}$, which are lower than the reference voltage $U_{Ref}$) can be integrated relative to the reference voltage $U_{Ref}$, and thus, the potential non-linearity caused by the method disclosed in U.S. Pat. No. 5,387,874 can be eliminated if the threshold voltages of the transistors serving as active members are different in magnitude. By accomplishing the stages 1 to 6 in the order described above, the circuit is used as a positive integrator. The sign of the integration can be changed into negative by changing the performance order of the above-mentioned clock stages 3 to 6 mutually, whereby the operation such as at stage 6 is accomplished after stage 2 and the operation as at stage 3 is carried out after stage 5. Now, also the signs of formulae (2) and (4) described above, and consequently, also of formulae (5) and (6) are inverted (positive becomes negative and negative becomes positive).

In the table below the voltages of the sampling capacitance $C_i$ are summarized in a circuit as in FIG. 8 both before and after closing of the switches taking place during each clock stage. In addition, Table 1 shows the charges transferred to the integrating capacitance $C_o$ in the last column as well as the charges of the entire circuit taken from the positive supply voltage VDD in the centremost column. In Table 2, the equivalent values are calculated when Uth1 = 0.4 V and Uth2 = 0.7 V, i.e. the threshold voltages of transistors T1 and T2 differ greatly from one another. As seen in Table 2, the total charge transferred is, as can be expected, $+C_i \times 0.5$ V when $U_s = 0.5$ V (i.e. $U_s + U_{Ref} = 3$ V), thus a difference in the magnitudes between the threshold voltages Uth1 and Uth2 of the transistors will not exert any effect because the effect thereof becomes entirely eliminated, as can be seen in formula (5). Respectively, if $U_s = -0.5$ V, i.e. $U_s + U_{Ref} = 2$ V, the transferring total charge would be $-C_i * 0.5$ V, that is, negative, so that the circuit according to the invention also operates at negative signal voltages ($U_s < 0$, i.e. $U_s + U_{Ref} < U_{Ref}$).

Figure 1A:
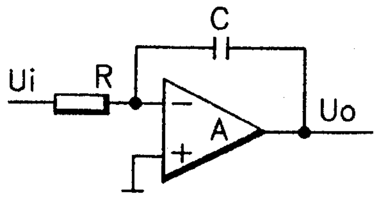
FIGS. 1*a* and 1*b* present integrating circuits continuously consuming current, according to state of the art
Figure 1B:
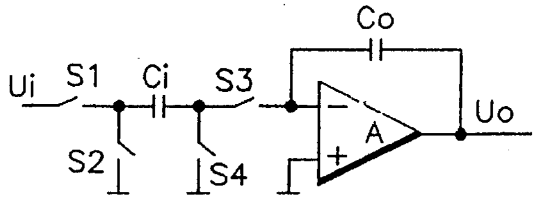

Provided that the clock stages 1 to 6 in the circuit presented in FIG. 8, at the values of Table 2, would be repeated at 100 kHz frequency, i.e. the sampling frequency from $U_s$ is 100 kHz, and if capacitance values $C_i = 5$ pF and $C_o = 20$ pF (the highest values on silicon circuits) were used, the circuit would acquire from the supply voltage VDD only a charge of $5 \times 10^{-12} \times 11.3$ As in a period of time which is 10 μs, that is, as an average current of only about 5 μA, this being extremely low compared e.g. with a typical 100 to 200 μA continuous current consumption of the operational amplifier integrator (as in FIG. 1*b*).

TABLE 1

Charge tranfers at integration stages as in FIGS. 10–13

| Clock stage | $U_i$ before | $U_i$ after (closing the switch) | ΔQ from VDD | ΔQ to $C_0$ |
|---|---|---|---|---|
| 1 | Uth2 | VDD | $C_i$ (VDD − Uth2) | — |
| 2 | VDD | $U_S + U_{Ref}$ + Uth1 | — | — |
| 3 | $U_S + U_{Ref}$ + Uth1 | Uth2 | $C_i(U_S + U_{Ref}$ + Uth1 − Uth2) | $C_i(U_S + U_{Ref}$ + Uth1 − Uth2) |
| 4 | Uth2 | VDD | $C_i$ (VDD − Uth2) | — |
| 5 | VDD | $U_{Ref}$ + Uth1 | — | — |
| 6 | $U_{Ref}$ + Uth1 | Uth2 | — | $-C_i(U_{Ref}$ + Uth1 − Uth2) |
| Total | — | — | $C_i${2VDD + $U_S + U_{Ref}$ + Uth1 − 3 Uth2} | $C_i(U_S + U_{Ref} - U_{Ref}) = C_i\,U_S$ |

TABLE 2

| Values according to Table 1 when VDD = 5 V $U_S$ = 0.5 V, $U_{Ref}$ = 2.5 V, Uth1 = 0.4 V and Uth2 = 0.7 V | | | | |
|---|---|---|---|---|
| Clock | $U_{Ci}$ | | ΔQ | ΔQ |
| stage | before | after | from VDD | to $C_0$ |
| 1 | 0.7 V | 5 V | $C_i$ * 4.3 V | |
| 2 | 5 V | 3.4 V | — | |
| 3 | 3.4 V | 0.7 V | $C_i$ * 2.7 V | +$C_i$ * 2.7 V |
| 4 | 0.7 V | 5 V | $C_i$ * 4.3 V | — |
| 5 | 5 V | 2.9 V | — | — |
| 6 | 2.9 V | 0.7 V | — | −$C_i$ * 2.2 V |
| Total | | | $C_i$ * 11.3 V | +$C_i$ * 0.5 V |

FIG. 14 presents an alternative circuit of the invention compared with the one described above, and FIG. 14 has further been divided into smaller parts for describing each clock stage in FIGS. 14*a*, 14*b*, 14*c* and 14*d*. Said circuit differs from the one illustrated in FIG. 8 in that for the transistor T1, an NPN transistor is used instead of a PNP transistor, and in the method used in the circuit no precharge is implemented from a higher (positive) supply voltage VDD, whereby the amount of clock stages required can be reduced. In a circuit as in FIG. 14 the switches $S_{11}$, $S_{13}$ and $S_{14}$ are closed during clock stage 1, whereby the sampling capacitor $C_i$ is charged by the amount of base emitter junction voltage Uth1 of the transistor T1 into a lower voltage than the input signal voltage $U_s$ produced relative to reference voltage $U_{Ref}$, i.e., into voltage $$U^1_{Ci} =]U^1_s + U_{Ref} - Uth1 \quad (7)$$

This is illustrated in FIG. 14*a*. FIG. 14*b* presents the components associated with clock stage 2. At clock stage 2 the switches $S_{15}$ and $S_{16}$ are closed so that the sampling capacitor $C_i$ supplies base current to the transistor T2 until it has discharged as far as the threshold voltage Uth2 of the base emitter junction of transistor T2, whereby the discharging thereof ends. Hereby, some charge is transferred from the sampling capacitor $C_i$ into the integrating capacitor $C_o$ until the voltage of the sampling capacitor $C_i$ has reduced to value Uth2 so that the following charge has been transferred into the integrating capacitor $C_o$ $$\Delta Q^2 =]C_i\,(U_s + U_{Ref} - Uth1 - Uth2) \quad (8)$$

At clock stage 3, the switches $S_{12}$, $S_{13}$ and $S_{14}$ are closed (FIG. 14*c*), whereby the sampling capacitor $C_i$ is connected via transistor T1 to the reference voltage $U_{Ref}$, leading the charge of the sampling capacitor $C_i$ into voltage $$U^3_{Ci} = U_{Ref} - Uth1 \quad (9)$$

At clock stage 4 the switches $S_{17}$ and $S_{18}$ are closed (FIG. 14*d*), whereby the sampling capacitor $C_i$ supplies base current to transistor T2 until it has discharged into the threshold voltage Uth2 of the base emitter junction of thus ending the discharging. Now, negative charge becomes added in the integrating capacitor $C_o$, whereby it is discharged through the sampling capacitor $C_i$ until the voltage of $C_i$ has reduced to value Uth2, whereby the negative charge added in the integrating capacitor $C_o$ is $$\Delta Q^4 =- C_i\,(U_{Ref} - Uth1 - Uth2) \quad (10)$$

The total charge transferred during clock stages 1 to 4 to the output of the circuit, emitted from the integrating capacitor $C_o$, is the sum of formulae (8) and (10), i.e.

$$\Delta Q^{1.4} = C_i\,(U_s + U_{Ref} - U_{Ref}) = C_i\,U_s \quad (11)$$

that is, a positive integrator is in question. The sign of the integration can be changed into negative by changing the order of performance of clock stages 2 and 4, whereby the operation as at clock stage 4 is accomplished after stage 1, and the operation as at clock stage 2 is accomplished after stage 3. Now, the signs of the above formulae (8) and (10), resp. formula (11) are also changed (positive becomes negative and negative becomes positive). The clock signals of the circuit shown in FIG. 14 are presented in FIG. 15, and it is described which of the switches of FIG. 14 are closed (i.e. conductive) when the signal of each clock stage is on (signal pulse).

FIG. 16 presents a circuit corresponding to FIG. 14 in an instance in which the active element controlling the current flow is a MOS transistor, here a MOS transistor with an N channel. In the method and in the circuit according to the invention, also a PMOS transistor can be used as the active member.

The circuit presented in FIG. 16 is described below by the aid of FIGS. 16*a*, 16*b*, 16*c* and 16*d*, illustrating as a circuit diagram the components related to the operation during each of the four clock stages 1 to 4. In the circuit according to FIG. 1*e* the switches $S_{21}$, $S_{21}$, $S_{23}$ and $S_{24}$ are closed (whereof the switches $S_{21}$ and $_{24}$ may be omitted also from the circuit), so that the sampling capacitor $C_i$ is charged by the amount of the threshold voltage of transistor T1, i.e. the gate/source voltage Uth1, into a lower voltage than the input signal voltage $U_s$ produced relative to the reference voltage $U_{Ref}$, that into a voltage as follows:

$$U^1_{Ci} = U^1_s + U_{Ref} - Uth1 \quad (12)$$

Figure 16A:
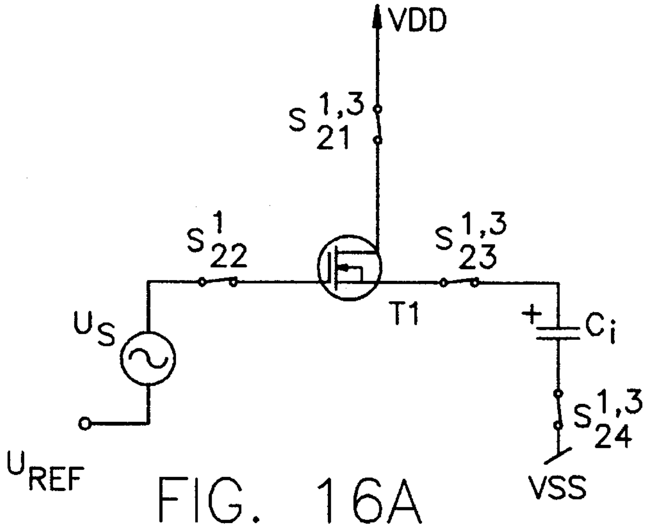
Figure 16B:
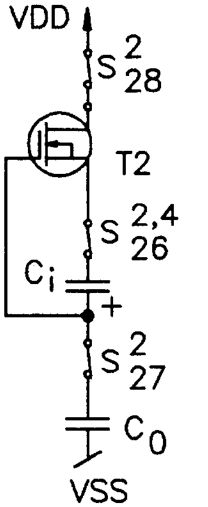
Figure 16C:
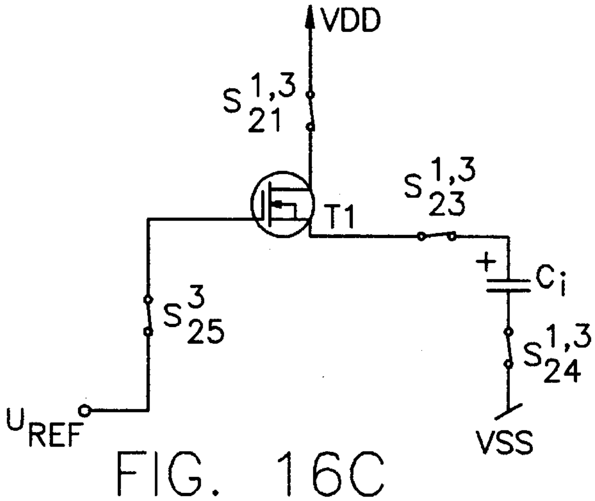
Figure 16D:
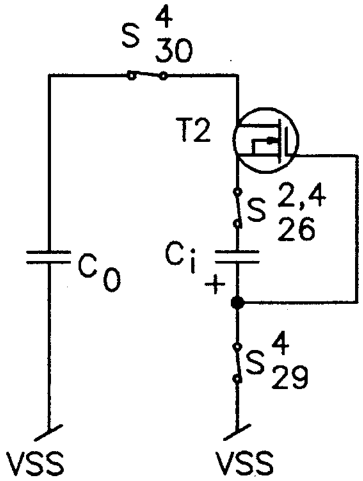

This is presented in FIG. 16*a*. FIG. 16*b* presents the components related to clock stage 2. During clock stage 2 the switches $S_{26}$, $S_{27}$ and $S_{28}$ are closed, whereby with the sampling capacitor $C_i$ a gate/source voltage is produced for transistor T2, thus enabling current flow from the positive supply voltage VDD to the integrating capacitor $C_o$ until the sampling capacitor $C_i$ has been discharged into the gate/source threshold voltage Uth2 of transistor T2, thus ending the passage of the current. Hereby, charge is conducted from the sampling capacitor $C_i$ to the integrating capacitor $C_o$ until the voltage of $C_i$ has reduced to value Uth2, whereby the following charge has been transferred into the integrating capacitor $C_o$:

$$\Delta Q^2 = C_i\,(U_s + U_{Ref} - Uth1 - Uth2) \quad (13)$$

At clock stage 3 the switches $S_{21}$, $S_{23}$, $S_{24}$ and $S_{25}$ are closed (FIG. 16*c*), whereby the sampling capacitor $C_i$ is connected via transistor T1 to the reference voltage $U_{Ref}$, thus charging $C_i$ into voltage $$U^3_{Ci} = U_{Ref} - Uth1 \quad (14)$$

At clock stage 4 the switches $S_{26}$, $S_{29}$ and $S_{30}$ are closed (FIG. 16*d*), whereby by the sampling capacitor $C_i$ a gate / source voltage is produced for transistor T2, thus enabling the current flow through the sampling capacitor $C_i$ from the integrating capacitor $C_o$ to the negative supply voltage VSS until the sampling capacitor $C_i$ has been discharged to the threshold voltage Uth2 of the gate / source junction of T2, thus ending the discharge thereof. Hereby, the negative charge summed in the integrating capacitor $C_o$ is as follows:

$$\Delta Q^4 = - C_i\,(U_{Ref} - Uth1 - Uth2) \quad (15)$$

The total charge transferred to the output of the circuit at clock stages 1 to 4, emitted from the integrating capacitor $C_o$, is the sum of formulae (13) and (15), i.e.

$$\Delta Q^{1.4} = C_i\,(U_s + U_{Ref} - U_{Ref}) = C_i\,U_s \tag{16}$$

thus, a positive integrator is in question. The sign of integration may be changed into negative by changing the order of performance of clock stages 2 and 4, whereby the operation as at clock stage 4 is accomplished after stage 1, and the operation at clock stage 2 is accomplished after stage 1. Now, also the signs of the formulae (13) and (15) described above, resp. also of formula (16) are changed (positive into negative and negative into positive). FIG. 17 presents the clock signals of a circuit as in FIG. 16, listing which of the switches of FIG. 16 are closed (i.e. conductive) when the signal of each clock stage is on (signal pulse).

As can be seen in formulae from (7) to (10) and (12) to (15), transferring of charge (here the transferring of charge means, as above, transfer of charge first to the sampling capacitor $C_i$, and thereafter, to the integrating capacitor $C_o$), in a circuit is possible on the condition that $$U_s + U_{Ref} > Uth\mathbf{1} + Uth\mathbf{2} \tag{17}$$

i.e., the sum of the signal voltage $U_s$ and the reference voltage $U_{Ref}$ (i.e. the signal voltage $U_s$ produced relative to reference voltage $U_{Ref}$) should be higher in relation to the OV potential than the sum of the threshold voltages of transistors T1 and T1 (base emitter junction voltages). For said reason, a circuit such as in FIG. 14 or 16 functions within a narrower voltage range than a circuit such as in FIGS. 8 to 13, though respectively, the circuits as in FIGS. 14 and 16 no procharge stages are required, thus operation is carried out with a lesser amount of clock stages, and substantially lees current is consumed than in circuits such as those shown in FIGS. 8 to 13. A circuit as in FIG. 14 operates with faster and more easily producable NPN transistors compared with PNP transistors.

The fact whether separate NPN and PNP transistors, identical NPN transistors are selected for transistors T1 and T2, or only one NPN transistor or MOS transistors is/are used, is dependent on the voltage range of the circuit, and on the requirements set for the circuit, such as speed. As regards power consumption and integratabiliy, the MOS design is preferred, whereas, e.g. in order to obtain high speed and low noise level, the use of separate NPN transistors is a good solution. In the present invention various transistors may thus be used, such as bi-polar transistors and MOS transistors, whereby different names are used of the respective electrodes of different transistors. As taught by the invention, the accompanying claims concern a transistor in general since the invention can be implemented merely with one charge transfer controlling transistor, as will be described in association with FIG. 18, and so, the electrodes are generally determined as follows: a common name for base (bipolar) and gate (MOS) is a controlling electrode, for collector (bipol.) and drain (MOS) a common name is current acquiring electrode, and for emitter (bipol.) and source (MOS), a common name is current supplying electrode.

A summary of the charge transfer of the circuit as in FIG. 14 is presented in Table 3 (respectively, as in Table 1). The current consumption can be calculated using the values of the preceding example:. $C_i$ = 5 pF, $C_o$ = 20 pF, and the repetition frequency 100 kHz, and as the other values the following:

$U_s$ = OV, $U_{Ref}$ = 2.5 V, ($U_{be1}$ =) Uth1 = 0.4 V and ($U_{be2}$ =) Uth2 = 0.7 V.

Hereby, during 10 microseconds from the supply voltage VDD a charge of 2.1 * $10^{-11}$ As is emitted, being equivalent to 2 μA average current.

TABLE 3

Transfers of charge at different clock stages of the integrating circuit according to FIG. 14

| Clock stage | $U_{Ci}$ before | $U_{Ci}$ after charge transfer | ΔQ from VDD | ΔQ to $C_0$ |
|---|---|---|---|---|
| 1 | Uth2 | $U_S + U_{Ref}$ − Uth1 | $C_i(U_S + U_{Ref}$ − Uth1 − Uth2) | — |
| 2 | $U_S + U_{Ref}$ − Uth1 | Uth2 | $C_i(U_S + U_{Ref}$ − Uth1 − Uth2) | $C_i(U_S + U_{Ref}$ − Uth1 − Uth2) |
| 3 | Uth2 | $U_{Ref}$ − Uth1 | $C_i(U_{Ref}$ − Uth1 − Uth2) | - |
| 4 | $U_{Ref}$ − Uth1 | Uth2 | — | $-C_i(U_{Ref}$ − Uth1 − Uth2) |
| Total | | | $C_i(3U_{Ref} + 2U_S$ − 3Uth1 − 3Uth2) | $C_i(U_S + U_{Ref} - U_{Ref}) = C_i\,U_S$ |

FIG. 18 presents how the invention can be implemented using merely one transistor. The method according to the invention can be implemented with one transistor, selected here to be transistor T2, by combining the electrodes of transistors T1 and T2 of the design as in FIG. 14, whereby a design as in FIG. 18 is produced, to which a switch $S_{20}$ has furthermore been added (which may also be added into FIG. 14, between the base of transistor T2 and the positive electrode of the sampling capacitor $C_i$, though in the design shown in FIG. 14 it is not necessary), and in addition, the switch $S_{15}$ is closed also during the clock stages 2 and 3, whereby the collector of the transistor T2 is connected to the positive supply voltage VDD during clock stages 1 to 3. Otherwise, the circuit as in FIG. 18 operates as the circuit according to FIG. 14, although for the active member, merely one transistor T2 is used. FIG. 19 presents the clock signals of the circuit according to FIG. 18, listing also which of the switches of FIG. 18 are closed (i.e. conductive) when the signal of each of the clock stages is on (signal pulse). Respectively, as from a circuit according to FIG. 14 a circuit can be implemented operating merely by the aid of one transistor controlling the transfer of charge, it is obvious to a person skilled in the art that also the circuits according to FIG. 8 and 16 can be implemented similarly using merely one transistor, by connecting the electrodes of transistors T1 and T2, and by adding a switch and changing the clocking of a switch, corresponding to the procedure in FIG. 18.

A common feature to the exemplary designs of the invention described above is that the negative and positive charges are not processed in separation in different transistors, as performed in U.S. Pat. No. 5,387,874 instead, charges are processed in both transistors according to the clock stages introduced above, irrespective of the polarity (positive or negative) of the in-put signal voltage $U_s$. Therefore, the potential differences in the threshold voltages of the transistors would not affect the signal processing because the effect of the threshold voltages is eliminated, as seen in formulae (5), (11) and (16).

In fact, with the method and signal processing circuit of the present invention the integration of the signal voltage is carried out. By the aid of the method and the circuit, also other forms of signal processing can be accomplished.

Increasing or decreasing the charge representing the signal without any current consumption taking place in the circuit are the basic processes for calculating the sum and difference of the signal samples. A person skilled in the art is by the aid of the circuit enabled to sum or subtract the values of different signals from one another or to produce integrals and derivates of signals and/or the sums thereof. E.g. summing two signals $U_{S1}$ and $U_{S2}$ is performed by accomplishing first the measures according to the invention for the first signal $U_{S1}$ and thereafter, equal measures to the second signal $U_{S2}$. The difference of two signals $U_{S1}$ and $U_{S2}$ is provided by accomplishing first the measures according to the invention for the first signal $U_{21}$ and thereafter, for the second signal $U_{S2}$ the measures of the inverting integration according to the invention, by changing the order of performance of two stages, as described above.

It is possible for a person skilled in the art to produce filters from the structures according to the invention and to arrange the supply voltages VDD, $U_{Ref}$, VSS within the circuit and the control voltages of the switches, and the substrate voltages of the semiconductor material (if the circuit of the invention is implemented as a circuit integrated on a semiconductor material) so that the current flow in the desired signal voltage ranges is possible and that all node voltages of the circuit are maintained within the desired limits, enabling the operations of the circuit, including also negative node voltages. In addition, it is possible to arrange the control of the switches so that the effect of the parasitic capacitances in association with the circuit is minimized.

The invention makes it possible that, in addition to low current consumption, the noise in the positive supply voltage VDD are in practice not coupled to the signals. The circuit is made completely currentless by stopping the clock signals and furthermore, into full operation, by starting the clock signals without any starting delay.

The invention is not limited to the above examples, but it can be applied within the limits of the accompanying claims within the scope of the knowledge governed by persons skilled in the art.

The method and the signal processing circuit according to the present invention can be used in filters, particularly in filters produced from integrators, and a preferred embodiment of the invention is an integrated circuit or a component of an integrated circuit. Since the signal processing circuit according to the invention is smallest in size as an integrated circuit, consumes little power and is a low-noise circuit, it is excellently appropriate for radio phones, e.g. for a portable radio receiver in which the filters produced therefrom may replace the ceramic filters currently used, e.g. in the intermediate frequency and detector circuits. When the invention is used in a radio phone, the control signals of the switches can be produced from the local oscillator frequency of the radio phone, for instance by the aid of a clock generator. The production of the control signals of said switches in a radio phone from the local oscillator frequency is in itself known to a person skilled in the art, and therefore, it is not described more in detail in the present context.

I claim:

1. A circuit for processing a signal comprising: a sampling capacitance;

a summing capacitance electrically coupleable to said sampling capacitance;

means for providing an input signal to be processed;

means for providing a predetermined reference signal selected to produce a sum signal, when summed with said input signal, that is always of the same polarity as said reference signal;

charge supplying means for supplying a quantity of charge of equivalent magnitude and opposite polarity to a quantity of charge representative of said reference signal;

means for summing said input signal and said reference signal and producing a quantity of charge representative of said sum signal on said sampling capacitance; and switching means, separately electrically coupling said summing means, said sampling capacitance, said summing capacitance, and said charge supplying means, for successively transferring;

a quantity of charge representative of the sum signal quantity of charge on the sampling capacitance, to the summing capacitance;

a quantity of charge having a magnitude and polarity representative of the reference signal, from said reference signal providing means to the sampling capacitance; and a quantity of charge of equivalent magnitude and opposite polarity to the quantity of charge transferred to the sampling capacitance representative of the reference signal, from said charge supplying means to the summing capacitance.

2. A circuit according to claim 1 wherein the switching means comprises switching elements for independently coupling the sum signal to the sampling capacitance, the sampling capacitance to the summing capacitance, the reference signal to the sampling capacitance, and the summing capacitance to said charge supplying means for supplying the quantity of charge of equivalent magnitude and opposite polarity as a quantity of charge representative of said reference signal.

3. A circuit according to claim 2 wherein the switching elements comprise an active element and said charge supplying means comprises a supply voltage for said active element.

4. A circuit according to claim 3 wherein the active element comprises a transistor and wherein said sum signal has a predetermined limiting value selected such that the transistor is actuated on application of the sum signal to the controlling electrode of the transistor.

5. A circuit according to claim 3 wherein the active element comprises a transistor having its controlling electrode coupled to the sampling capacitance and wherein when the charge quantity on the sampling capacitance reaches a predetermined lower magnitude the transistor switches off.

6. A circuit according to claim 2 further comprising means for controlling said switching elements such that current flow in the circuit stops on completion of each charge transfer.

7. A circuit according to claim 1 wherein the sum signal has a positive limit and said summing means comprises a voltage source more positive than the positive limit of the sum signal.

8. A circuit according to claim 1 wherein the sum signal has a negative limit and said summing means comprises a voltage source more negative than the negative limit of the sum signal.

9. The method for processing a signal comprising the steps of:

providing an input signal;

summing the input signal with a predetermined reference signal selected to provide a sum signal that is bounded on one side by a predetermined limiting value;

transferring a quantity of charge representative of the sum signal onto a sampling capacitance;

then transferring a quantity of charge after a predetermined time to a summing capacitance, said quantity of charge transferred to said summing capacitance being representative of the quantity of charge transferred onto the sampling capacitance;

then transferring a quantity of charge representative of the reference signal to the sampling capacitance; and, then transferring a quantity of charge, of equivalent magnitude and opposite polarity to the quantity of charge transferred to the sampling capacitance representative of the reference signal, to the summing capacitance.

10. A method according to claim 9 wherein the steps of transferring comprise sequentially actuating switching elements such that current flow stops on completion of each charge transfer.

11. A method according to claim 9 wherein the step of summing the input signal with a predetermined reference signal comprises applying said input and reference signals to the controlling electrode of a transistor and wherein said predetermined limiting value of the sum signal is selected such that the transistor is actuated on application of the sum signal to the controlling electrode of the transistor.

12. A method according to claim 9 wherein the step of summing the input signal with a predetermined reference signal comprises applying said input and reference signals to an electrode of a transistor having an electrode coupled to the sampling capacitance and wherein said predetermined limiting value of the sum signal is selected such that when the charge quantity on the sampling capacitance reaches a predetermined lower magnitude the transistor switches off.

13. A method according to claim 9 wherein the step of transferring a quantity of charge, of equivalent magnitude and opposite polarity to the quantity of charge transferred to the sampling capacitance representative of the reference signal, to the summing capacitance comprises coupling said summing capacitance to a transistor and said quantity of charge is supplied by the supply voltage of said transistor.

14. A signal processing circuit comprising:

means for summing an input signal to be processed with a predetermined reference signal selected to produce a sum signal, when summed with said input signal, that is bounded on one side by a predetermined limiting value and always of the same polarity as said reference signal;

means for supplying a quantity of charge of equivalent magnitude and opposite polarity to a quantity of charge representative of said reference signal;

charge transferring capacitance means for receiving quantities of charge representative of said sum signal and said reference signal;

integrating capacitance means, electrically coupleable to said charge transferring capacitance means and said means for supplying a quantity of charge of equivalent magnitude and opposite polarity to a quantity of charge representative of said reference signal, for receiving quantities of charge representative of said quantity of charge received by said charge transferring capacitance means representative of said sum signal and said quantity of charge of equivalent magnitude and opposite polarity to a quantity of charge representative of said reference signal; and switching means for electrically coupling said charge transferring capacitance means to said integrating capacitance means, and for separately electrically coupling said means for supplying a quantity of charge, of equivalent magnitude and opposite polarity to a quantity of charge representative of said reference signal, to said integrating capacitance means;

and wherein said switching means comprises:

means for transferring a quantity of charge representative of the sum signal onto said charge transferring capacitance means;

means for transferring a quantity of charge to said integrating capacitance means, said quantity of charge transferred to said integrating capacitance means being representative of the quantity of charge transferred onto said charge transferring capacitance means representative of the sum signal;

means for transferring a quantity of charge representative of the reference signal to said charge transferring capacitance means;

means for transferring a quantity of charge, of equivalent magnitude and opposite polarity to the quantity of charge transferred to the charge transferring capacitance means representative of the reference signal, to said integrating capacitance means; and clocking means for sequentially controlling the operation of said foregoing means for transferring charge quantities to said charge transferring capacitance means and said integrating capacitance means whereby current flow stops on completion of each charge quantity transfer.

15. A signal processing circuit as in claim 14 wherein said sum signal has a positive limiting value and said summing means comprises a transistor and a voltage source more positive than the positive limiting value of the sum signal.

16. A signal processing circuit as in claim 14 wherein said sum signal has a negative limiting value and said summing means comprises a transistor and a voltage source more negative than the negative limiting value of the sum signal.

17. A signal processing circuit as in claim 14 wherein said summing means comprises a transistor having a controlling electrode for receiving said sum signal and said predetermined limiting value of the sum signal is such that the transistor is actuated on application of the sum signal to the controlling electrode of the transistor.

18. A signal processing circuit as in claim 14 wherein said switching means comprises a transistor having its controlling electrode coupled to the charge transferring capacitance means and a supply voltage such that when the charge quantity on the sampling capacitance reaches a predetermined lower magnitude the transistor switches off.

19. A signal processing circuit as in claim 14 wherein said means for supplying a quantity of charge of equivalent magnitude and opposite polarity to a quantity of charge representative of said reference signal comprises a transistor having a supply voltage and said quantity of charge is supplied by the supply voltage of said transistor.

* * * * *